US006876208B2

(12) United States Patent
Kunikiyo et al.

(10) Patent No.: US 6,876,208 B2
(45) Date of Patent: Apr. 5, 2005

(54) SEMICONDUCTOR DEVICE AND METHOD OF CHECKING SEMICONDUCTOR STORAGE DEVICE

(75) Inventors: Tatsuya Kunikiyo, Tokyo (JP); Katsumi Eikyu, Tokyo (JP); Kyoji Yamashita, Kyoto (JP); Katsuhiro Ohtani, Nara (JP); Hiroyuki Umimoto, Hyogo (JP); Mutsumi Kobayashi, Kyoto (JP)

(73) Assignees: Renesas Technology Corp., Tokyo (JP); Matsushita Electric Industrial Co., Ltd., Kadoma (JP)

( * ) Notice: Subject to any disclaimer, the term of this patent is extended or adjusted under 35 U.S.C. 154(b) by 29 days.

(21) Appl. No.: 10/232,689

(22) Filed: Sep. 3, 2002

(65) Prior Publication Data

US 2003/0117151 A1 Jun. 26, 2003

(30) Foreign Application Priority Data

Dec. 25, 2001 (JP) ........................................ 2001-391667

(51) Int. Cl.[7] .......................... H01L 23/58; G01R 27/26
(52) U.S. Cl. ........................... 324/658; 324/663; 257/48
(58) Field of Search ......................... 257/48, 139, 378; 324/658, 663, 686, 690

(56) References Cited

U.S. PATENT DOCUMENTS

| 5,999,010 | A | | 12/1999 | Arora et al. ................ 324/765 |
|---|---|---|---|---|
| 6,153,896 | A | * | 11/2000 | Omura et al. ................ 257/139 |
| 6,404,222 | B1 | | 6/2002 | Fan et al. .................... 324/765 |

FOREIGN PATENT DOCUMENTS

| JP | 57-211277 | 12/1982 |
|---|---|---|
| JP | 11-251391 | 9/1999 |
| TW | 464764 | 11/2001 |

OTHER PUBLICATIONS

Dennis Sylvester, et al., "Investigation of Interconnect Capacitance Characterization Using Charge–Based Capacitance Measurement (CBCM) Technique and Three–Dimensional Simulation", IEEE Journal of Solid–State Circuits, vol. 33, No. 3, Mar. 1998, pp. 449–453.

* cited by examiner

Primary Examiner—N. Le
Assistant Examiner—John Teresinski
(74) Attorney, Agent, or Firm—Oblon, Spivak, McClelland, Maier & Neustadt, P.C.

(57) ABSTRACT

It is an object to obtain a semiconductor device having a circuit for CBCM (Charge Based Capacitance Measurement) which can measure a capacitance value with high precision. An MOS transistor constituting a circuit for CBCM has the following structure. More specifically, source-drain regions (4) and (4') are selectively formed in a surface of a body region (16), and extension regions (5) and (5') are extended from tip portions of the source-drain regions (4) and (4') opposed to each other, respectively. A gate insulating film 7 is formed between the source-drain regions (4) and (4') including the extension regions (5) and (5') and a gate electrode (8) is formed on the gate insulating film (7). A region corresponding to a pocket region 6 (6') in a conventional structure having a higher impurity concentration than that of a channel region is not formed in a tip portion of the extension region 5 (5') and a peripheral portion of the extension region (5).

12 Claims, 25 Drawing Sheets

F I G. 13
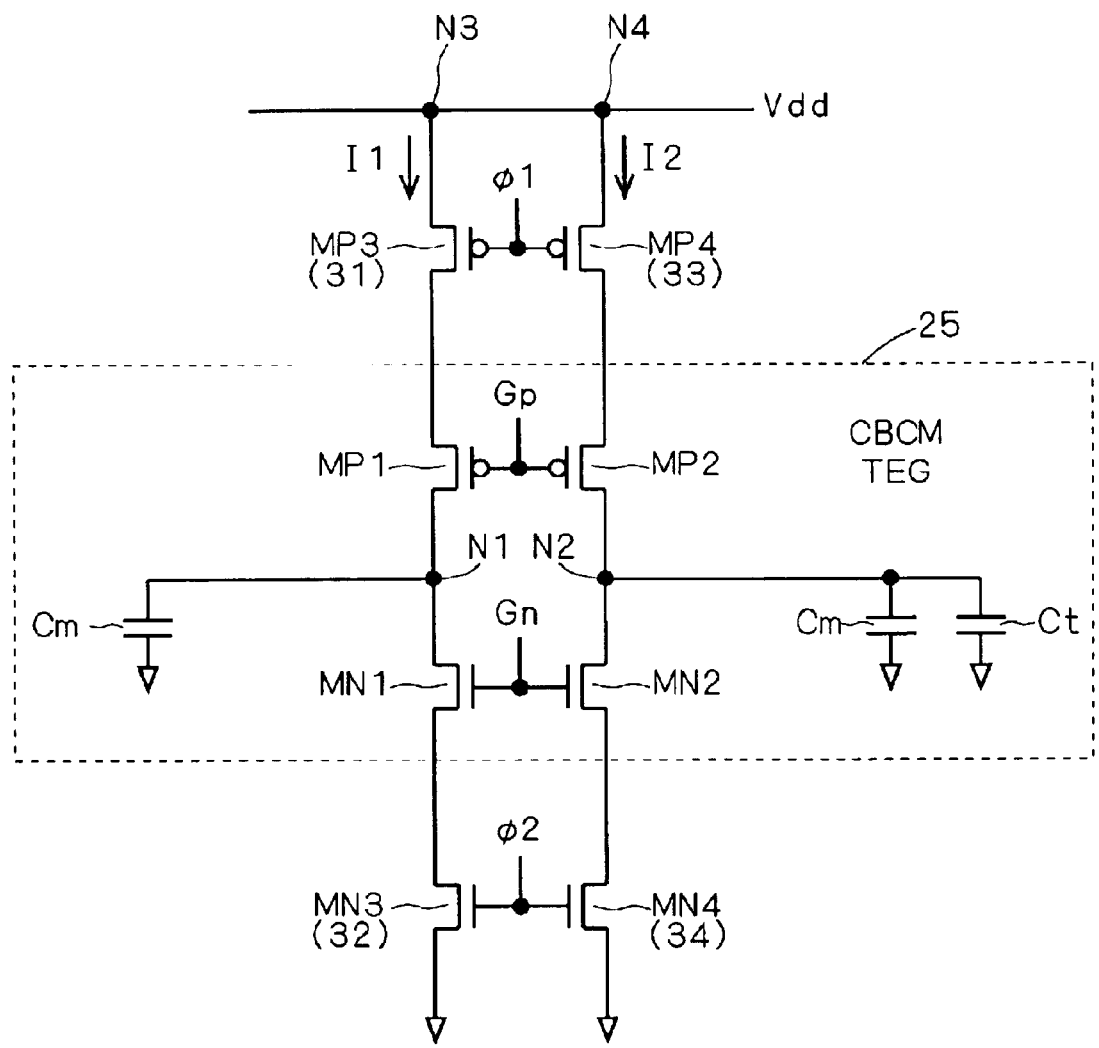

$Ccbcm = Cndb + Cngd + Cpdb + Cpgd$

F I G. 35
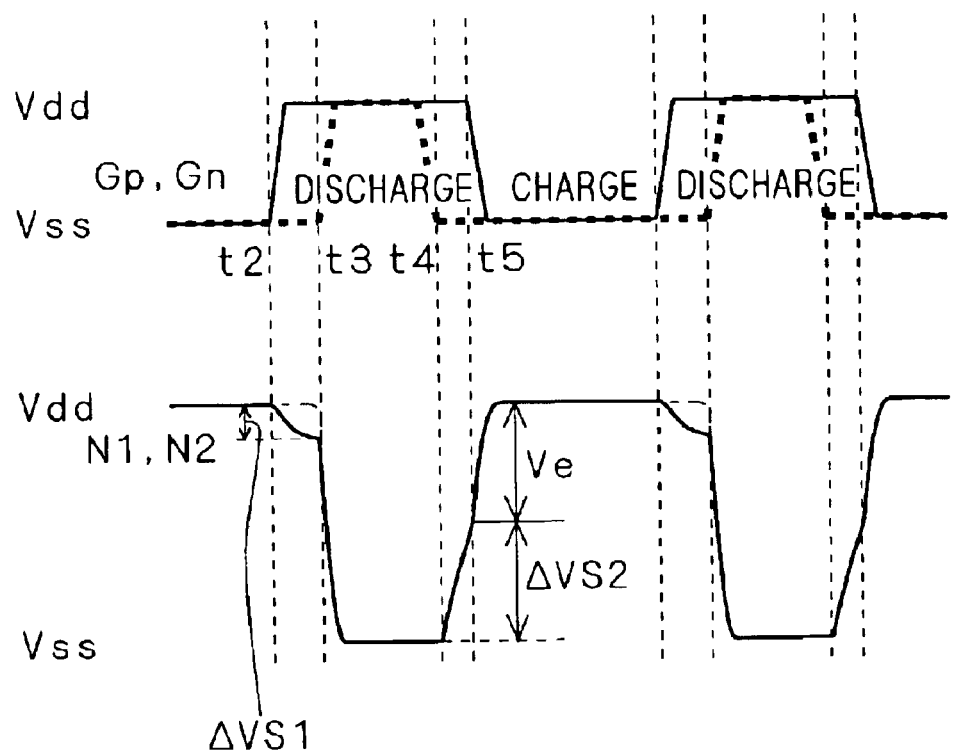

SEMICONDUCTOR DEVICE AND METHOD OF CHECKING SEMICONDUCTOR STORAGE DEVICE

BACKGROUND OF THE INVENTION

1. Field of the Invention

The present invention generally relates to a semiconductor device having the function of measuring various capacitances such as a wiring capacitance, a gate capacitance and a junction capacitance, and more particularly to a semiconductor device having a circuit for CBCM (Charge Based Capacitance Measurement) using a CBCM method as a capacitance measuring method.

2. Description of the Background Art (Principle of CBCM Method)

FIG. 33 is a circuit diagram showing a structure of a circuit for CBCM in a semiconductor device employing a conventional CBCM method. As shown in FIG. 33, a PMOS transistor MP1 and an NMOS transistor MN1 are connected in series, and a PMOS transistor MP2 and an NMOS transistor MN2 are connected in series. A source of the PMOS transistor MP1 is connected to a pad 52 and a source of the PMOS transistor MP2 is connected to a pad 54, and sources of the NMOS transistors MN1 and MN2 are connected to a pad 55 in common. Moreover, a pad 53 is connected to gates of the PMOS transistors MP1 and MP2 and a pad 51 is connected to a well region to be a back gate, and a pad 56 is connected to gates of the NMOS transistors MN1 and MN2.

Furthermore, an electric potential NW, a reference potential Ref, a PMOS gate potential Gp, a test potential Tst, an electric potential Gnd and an NMOS gate potential Gn are applied to the pads 51, 52, 53, 54, 55 and 56, respectively. The electric potential NW is used for setting an electric potential in well regions of the PMOS transistors MP1 and MP2, and the electric potential Gnd gives an electric potential to active regions (not shown) and the sources in the NMOS transistors MN1 and MN2.

The PMOS transistors MP1 and MP2 and the NMOS transistors MN1 and MN2 make pairs having gate lengths, gate widths and gate insulating film thicknesses which are equal to each other.

A reference capacitance Cref (capacitance value=Cm (dummy capacitance)) is provided between a drain (node N1) and the source in the NMOS transistor MN1, and a test capacitance Ctst (capacitance value=Cm+Ct (target capacitance)) is provided between a drain (node N2) and the source in the NMOS transistor MN2. The circuit for CBCM shown in FIG. 33 has an object to measure the target capacitance Ct.

FIG. 34 is a timing chart showing an operation of the circuit for CBCM illustrated in FIG. 33. An operation for measuring a capacitance value of a conventional circuit for CBCM will be described below with reference to FIG. 34.

As shown in FIG. 34, the reference potential Ref, the test potential Tst and the electric potential NW are fixed to a power supply potential Vdd, and the electric potential Gnd is fixed to a ground potential Vss. Input voltage waveforms of the PMOS gate potential Gp and the NMOS gate potential Gn are applied to turn ON one of the NMOS transistors MN1 and MN2 and the PMOS transistors MP1 and MP2 at any time. At the same time, accordingly, a through current flowing from the PMOS transistor MP1 to the NMOS transistor MN1 or from the PMOS transistor MP2 to the NMOS transistor MN2 is not generated.

As shown in FIG. 34, the PMOS transistors MP1 and MP2 are turned ON to supply currents I1 and I2 from the pads 52 and 54, thereby charging the reference capacitance Cref and the test capacitance Ctst for a time t1 to t2. In the meantime, both of the NMOS transistors MN1 and MN2 are set in an OFF state. Therefore, electric potentials of the nodes N1 and N2 connected to the reference capacitance Cref and the test capacitance Ctst reach the power supply potential Vdd.

For a time t2 to t3, all of the PMOS transistors MP1 and MP2 and the NMOS transistors MN1 and MN2 are turned OFF. Ideally, electric charges applied to the reference capacitance Cref and the test capacitance Ctst are held. Therefore, the electric potentials of the nodes N1 and N2 maintain the power supply potential Vdd.

For a time t3 to t4, only the NMOS transistors MN1 and MN2 are turned ON. Therefore, the electric charges applied to the reference capacitance Cref and the test capacitance Ctst are discharged from the pad 56 so that the electric potentials of the nodes N1 and N2 reach the ground potential Vss.

For a time t4 to t5, all of the MOS transistors are turned OFF. Ideally, the reference capacitance Cref and the test capacitance Ctst maintain the ground potential Vss which is obtained when the discharge is completed.

The above-mentioned operation is set to be one period T (a time from t1 to t5), and subsequently, this operation is repeated. Time mean values of the currents I1 and I2 are observed by a measuring device. The following equation (1) is established, wherein a frequency of a gate input waveform (Gp, Gn) is represented by f(=1/T).

$$I2 - I1 = \frac{Ctst \times Vdd}{T} - \frac{Cref \times Vdd}{T} \quad (1)$$
$$= \frac{(Cm + Ct - Cm) \times Vdd}{T}$$
$$= Ct \times Vdd \times f$$

Accordingly, a target capacitance value Ct is obtained by the following equation (2).

$$Ct = \frac{I2 - I1}{Vdd \times f} \quad (2)$$

The CBCM method has an advantage that a dummy capacitance (a parasitic capacitance) Cm can be cancelled as shown in the equation (1), thereby obtaining a desirable target capacitance Ct.

(Error Factor of CBCM Method)

The error factor of the CBCM method includes 1) precision in a measuring device, 2) a leak component of a transistor which is in an OFF state, and 3) a mismatch of transistors making a pair. The items 2) and 3) will be described below in detail.

2) FIG. 35 is a chart showing a fluctuation in an electric potential which is caused by an offleak of a transistor. FIG. 35 shows a part of the timing chart in FIG. 34 (Gp (solid line), Gn (dotted line), and N1 and N2) which is enlarged.

As shown in FIG. 35, the NMOS transistors MN1 and MN2 are turned ON for a time t3 to t4 so that the electric potentials of the nodes N1 and N2 reach the ground potential Vss. At a time t4 to t5, then, all of the PMOS transistors MP1 and MP2 and the NMOS transistors MN1 and MN2 are turned OFF.

Ideally, the offleak current is not generated. Therefore, the electric potentials of the nodes N1 and N2 are held in the ground potential Vss and the offleak current is actually present. When the amount of electric charges held in the reference capacitance Cref and the test capacitance Ctst is decreased by the amount of electric charges given with the offleak current for the time t4 to t5, the electric potentials of the nodes N1 and N2 rise by a fluctuation ΔVS2 in an electric potential during a standby from the ground potential Vss as shown in FIG. 35. A fluctuation ΔVS1 in an electric potential in the standby state indicates a reduction in the electric potential from the power supply potential Vdd.

Such a phenomenon is remarkable when the reference capacitance Cref and the test capacitance Ctst are in order of 0.01 fF to 1 pF. After the time t5, accordingly, charging is not carried out with a potential difference of the power supply potential Vdd but with a potential difference of Ve(=Vdd−ΔVS2) due to the rise. Since the capacitance values connected to the nodes N1 and N2 are different from each other, a value of the potential difference Ve is also varied between the nodes N1 and N2. In order to calculate a portion having the potential difference Ve with the power supply potential Vdd by the equation (2), an estimation of the target capacitance Ct is measured to be smaller. More specifically, it is implied that a fluctuation in the electric potentials of the nodes N1 and N2 which are caused by an offleak causes a measurement error.

3) The mismatch of the transistors making a pair implies that a threshold voltage, a drain current, a gate offleak current, a gate tunnel current, a junction capacitance, a gate overlap capacitance and the like are changed due to a variation in a process even if the PMOS transistors MP1 and MP2 and the NMOS transistors MN1 and MN2 have the same sizes on masks, respectively. As indicated in the equation (2), the target capacitance Ct is measured by utilizing a difference in currents of the transistors making a pair. Therefore, the identity of electric characteristics of the transistors making a pair determine measuring precision.

As shown in FIG. 35, the NMOS transistors MN1 and MN2 are turned ON and the electric charges stored in the reference capacitance Cref and the test capacitance Ctst are discharged. Then, when all of the PMOS transistors MP1 and MP2 and the NMOS transistors MN1 and MN2 are OFF in the standby state, the electric potentials of the nodes N1 and N2 rise by the influence of the gate offleak current. Consequently, there is a problem in that the measuring precision in the target capacitance Ct is reduced.

Moreover, the gate length and the gate insulating film thickness of the transistor tend to be reduced due to high integration. When a gate insulating film formed by a silicon oxide film or a silicon oxide nitride film has a thickness of approximately 2 nm, there is observed a gate tunnel phenomenon in which electrons or holes tunnel through the gate insulating film while they run over a channel from a source to reach a drain. When the transistor is ON, tunneling from a source region having the greatest potential difference from a gate voltage is carried out more often. When the transistor is OFF, the tunneling from a drain region is carried out more often. A gate tunnel current is observed as a gate current. If the gate tunnel current is generated, a drain current is decreased during ON and a gate-off current is increased during OFF as compared with the case in which the tunnel current is not generated. Accordingly, even if the thickness of the gate insulating film is reduced, an increase in the drain current during ON cannot be expected. By using a transistor including a gate insulating film having a thickness of approximately 2 nm for the CBCM method, there is a problem in that the same phenomenon as that in FIG. 35 occurs to reduce the measuring precision in the target capacitance Ct because a gate offleak is great.

SUMMARY OF THE INVENTION

It is an object of the present invention to obtain a semiconductor device having a circuit for CBCM which can measure a capacitance value with high precision.

A first aspect of the present invention is directed to a semiconductor device having an insulated gate type transistor formed in a semiconductor substrate and constituting a circuit for CBCM (Charge Based Capacitance Measurement), the insulated gate type includes a gate insulating film, a gate electrode, and a source-drain region of a second conductivity type, the gate insulating film is formed selectively on the semiconductor substrate, the gate electrode is formed on the gate insulating film, and the source-drain region of the second conductivity type which is formed to interpose therebetween a body region of a first conductivity type provided under the gate electrode in a surface of the semiconductor substrate, the body region has an impurity concentration in a vicinal region of the source-drain region which is equal to that in a non-vicinal region.

According to the present invention, as described above, the body region has an impurity concentration in a vicinal region of the source-drain region which is equal to that in a non-vicinal region in the insulated gate type transistor.

Accordingly, a junction concentration between the body region and the source-drain region is reduced and an electric field strength applied to the junction is suppressed. Therefore, a leakage current is reduced when the insulated gate type transistor is OFF. Consequently, it is possible to enhance capacitance value measuring precision by the CBCM method.

Preferably, in the semiconductor device, the source-drain region includes a source-drain region having an impurity concentration of $10^{18}/cm^3$ or less.

According to the present invention, the impurity concentration of the source-drain region is reduced sufficiently so that an electric field applied to the junction of the source-drain region and the body region can be relieved. As a result, it is possible to suppress a leakage current when the insulated gate type transistor is OFF.

Preferably, in the semiconductor device, the source-drain region includes a first partial source-drain region being a first formation depth, and a second partial source-drain region being a second formation depth which is greater than the first formation depth, and the first and second partial source-drain regions form first and second PN junctions together with the body region, respectively, and an impurity concentration in the second PN junction is set to be lower than that in the first PN junction.

According to the present invention, the impurity concentration of the second PN junction between the second partial source-drain region and the body region is set to be lower than the impurity concentration of the first PN junction between the first partial source-drain region and the body region. Therefore, a depletion layer in the vicinity of the second PN junction is formed to be larger than that in the vicinity of the first PN junction.

As a result, an electric field strength can be reduced in the vicinity of the PN junction as a whole. Consequently, it is possible to suppress a leakage current when the insulated gate type transistor is OFF.

A second aspect of the present invention is directed to a semiconductor device having an insulated gate type transistor formed in a semiconductor substrate and constituting a circuit for CBCM, the insulated gate type transistor includes a bottom layer, a well region, a gate insulating film, a gate electrode, and a source-drain region of a second conductivity type, the bottom layer of a predetermined conductivity type is formed on the semiconductor substrate, the well region of a first conductivity type is formed on the bottom layer, the gate insulating film is formed selectively on the well region, the gate electrode formed on the gate insulating film, and a source-drain region of the second conductivity type is formed to interpose the well region provided under the gate electrode in a surface of the well region.

According to the present invention, in the case in which the first conductivity type is identical to a predetermined conductivity type, an electric potential of a well region is fixed by the bottom layer. Therefore, if the conductivity types are different from each other, the electric potential of the bottom layer is set such that the PN junction formed by the bottom layer and the well region is reversely biased. Consequently, it is possible to shield a noise from the semiconductor substrate into the well region. As a result, measuring precision can be enhanced.

Preferably, the semiconductor device further includes a second insulated gate type transistor formed in the semiconductor substrate and constituting a logic circuit, the insulated gate type transistor has an electrical characteristic having higher capacitance value measuring precision by a CBCM method than that in the second insulated gate type transistor.

According to the present invention, the insulated gate type transistor for the CBCM circuit has an electrical characteristic with higher capacitance value measuring precision by the CBCM method than the second insulated gate type transistor constituting the logic circuit. Correspondingly, the capacitance value measuring precision can be enhanced.

A third aspect of the present invention is directed to a semiconductor device having a first insulated gate type transistor and a second insulated gate type transistor, the first insulated gate type transistor constitutes a circuit for CBCM, the second insulating gate type transistor constitutes a logic circuit, and the first insulated gate type transistor has an electrical characteristic having higher capacitance value measuring precision by a CBCM method than that in the second insulated gate type transistor.

According to the present invention, the first insulated gate type transistor for the CBCM circuit has an electrical characteristic with higher capacitance value measuring precision by the CBCM method than the second insulated gate type transistor for the logic circuit. Correspondingly, the capacitance value measuring precision can be enhanced.

Preferably, in the semiconductor device, the first insulated gate type transistor receives supply of a power having a different electric potential from that of the second insulated gate type transistor.

According to the present invention, the first insulated gate type transistor for the CBCM circuit receives power supply with a different electric potential from that of the second insulated gate type transistor for the logic circuit. Consequently, it is possible to effectively suppress a leakage current or to measure a comparatively great capacitance value.

Preferably, the semiconductor device further includes a third insulated gate type transistor constituting a semiconductor storage device and the first insulated gate type transistor has a transistor size equal to that of the third insulated gate type transistor.

According to the present invention, the first insulated gate type transistor for the CBCM circuit has a transistor size equal to that of the third insulated gate type transistor for the semiconductor storage device which has a comparatively large transistor size. Consequently, it is possible to suppress an offleak current. Correspondingly, the capacitance value measuring precision can be enhanced.

Preferably, the semiconductor device further includes a fourth insulated gate type transistor for an input/output circuit and the first insulated gate type transistor has a transistor size equal to that of the fourth insulated gate type transistor.

According to the present invention, the first insulated gate type transistor for the CBCM circuit has a transistor size equal to that of the fourth insulated gate type transistor for the input/output circuit which has a comparatively large transistor size. Consequently, an offleak current can be suppressed. Correspondingly, the capacitance value measuring precision can be enhanced.

Preferably, in the semiconductor device, the first insulated gate type transistor has a greater thickness of a gate insulating film than that of the second insulated gate type transistor.

According to the present invention, the first insulated gate type transistor for the CBCM circuit has a greater thickness of the gate insulating film than that in the second insulated gate type transistor for the logic circuit. Consequently, a gate tunnel leakage current can be suppressed.

Preferably, in the semiconductor device, the first insulated gate type transistor has a greater thickness of a gate insulating film than that of the fourth insulated gate type transistor.

According to the present invention, the first insulated gate type transistor for the CBCM circuit has a greater thickness of the gate insulating film than that in the fourth insulated gate type transistor for the input/output circuit which has a comparatively large transistor size. Consequently, it is possible to greatly suppress a gate tunnel leakage current.

Preferably, in the semiconductor device, the first insulated gate type transistor has a greater gate length of a gate electrode than that of the second insulated gate type transistor.

According to the present invention, the gate length of the gate electrode in the first insulated gate type transistor for the CBCM circuit can be made greater than that of the second insulated gate type transistor for the logic circuit. Consequently, it is possible to suppress a variation in an electrical characteristic of the transistor in a manufacturing process.

A fourth aspect of the present invention is directed to a semiconductor device having a first insulated gate type transistor of a first conductivity type, a second insulated gate type transistor of a second conductivity type and a capacitance for a test which are formed in a semiconductor substrate and constitute a circuit for CBCM, the first insulated gate type transistor has one electrode connected to a first power supply and the other electrode connected to the capacitance for a test, and is brought into an ON state for a charging period, thereby charging the capacitance for a test by means of the first power supply, and the second insulated gate type transistor has one electrode connected to a second power supply and the other electrode connected to the capacitance for a test, and is brought into an ON state for a discharging period, thereby discharging the capacitance for a test by means of the second power supply, the semiconductor device further includes a power supply connection switching portion for electrically connecting the first power supply to one electrode of the first insulated gate type transistor only for the charging period and a vicinal period thereof and for electrically connecting the second power supply to one electrode of the second insulated gate type transistor only for the discharging period and a vicinal period thereof.

According to the present invention, switching is carried out by the power supply connection switching portion such that the first power supply is effective only for the charging period and the vicinal period thereof and the second power supply is effective only for the discharging period and the vicinal period thereof. Consequently, it is possible to effectively suppress an OFF current during a standby when the first and second insulated gate type transistors are OFF.

Preferably, in the semiconductor device, the power supply connection switching portion includes a first and second insulated gate type transistors, the first insulated gate type transistor for power supply connection is provided between the first power supply and one electrode of the first insulated gate type transistor and is turned ON/OFF in response to a first control signal sent to a control electrode, the second insulated gate type transistor for power supply connection is provided between the second power supply and one electrode of the second insulated gate type transistor and is turned ON/OFF in response to a second control signal sent to the control electrode.

According to the present invention, the first and second insulated gate type transistors for power supply connection are turned ON/OFF, thereby electrically connecting/blocking one of the electrodes of each of the first and second insulated gate type transistors of the first and second power supplies. Consequently, it is possible to implement the power supply connection switching portion with a comparatively simple structure.

Preferably, the semiconductor device further includes a level holding circuit which is connected to a charge/discharge terminal to be the other electrodes of the first and second insulated gate type transistors and serves to hold an electric potential of the charge/discharge terminal.

According to the present invention, it is possible to suppress a fluctuation in the electric potential of the charge/discharge terminal in a standby state in which the first and second insulated gate type transistors are to be turned OFF by the level holding circuit.

Preferably, in the semiconductor device, the first and second insulated gate type transistors for power supply connection have absolute values of threshold voltages set to be greater than an absolute value in the first insulated gate type transistor.

According to the present invention, the absolute value of the threshold voltage in each of the first and second insulated gate type transistors for power supply connection is set to be greater than that in the first insulated gate type transistor for the CBCM circuit. Therefore, it is possible to suppress a leakage current in the standby state.

Preferably, in the semiconductor device, the level holding circuit has an insulated gate type transistor for level holding, the insulated gate type transistor for level holding having an absolute value of a threshold voltage set to be greater than that in the first insulated gate type transistor.

According to the present invention, the insulated gate type transistor for level holding has the absolute value of the threshold voltage set to be greater than that in the first insulated gate type transistor for the CBCM circuit. Therefore, it is possible to suppress the leakage current flowing in the level holding circuit in the standby state.

A fifth aspect of the present invention is directed to a semiconductor device including, in one chip, a circuit for CBCM and a control circuit for controlling an operation of the circuit for CBCM.

According to the present invention, the circuit for CBCM and the control circuit are formed into one chip. Consequently, it is possible to measure a capacitance value by the CBCM method without sending a control signal from the outside.

Preferably, in the semiconductor device, the circuit for CBCM includes a plurality of partial circuits for CBCM, the semiconductor device further includes an enable circuit for separately controlling an active state of each of the partial circuits for CBCM.

According to the present invention, it is possible to selectively utilize a plurality of partial circuits for CBCM by the enable circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a circuit diagram showing the structure of the first mode, specifically illustrating a source voltage switching portion in FIG. 12, FIG. 35 is a timing chart showing the details of the operation of the circuit for CBCM in FIG. 34.

DESCRIPTION OF THE PREFERRED EMBODIMENTS

First Embodiment

A semiconductor device for CBCM according to a first embodiment of the present invention is characterized in that a gate offleak current is smaller than that in other logic transistors mounted on the same chip. Moreover, the semiconductor device for CBCM is characterized by a structure in which a noise caused by an interface of a semiconductor substrate and a gate insulating film is reduced.

As will be described below in detail, the semiconductor device for CBCM according to the first embodiment of the present invention produces the effect of enhancing measuring precision in a target capacitance because a gate offleak current and a noise are smaller than those in a conventional structure.

(Conventional Structure)

Figure 1:
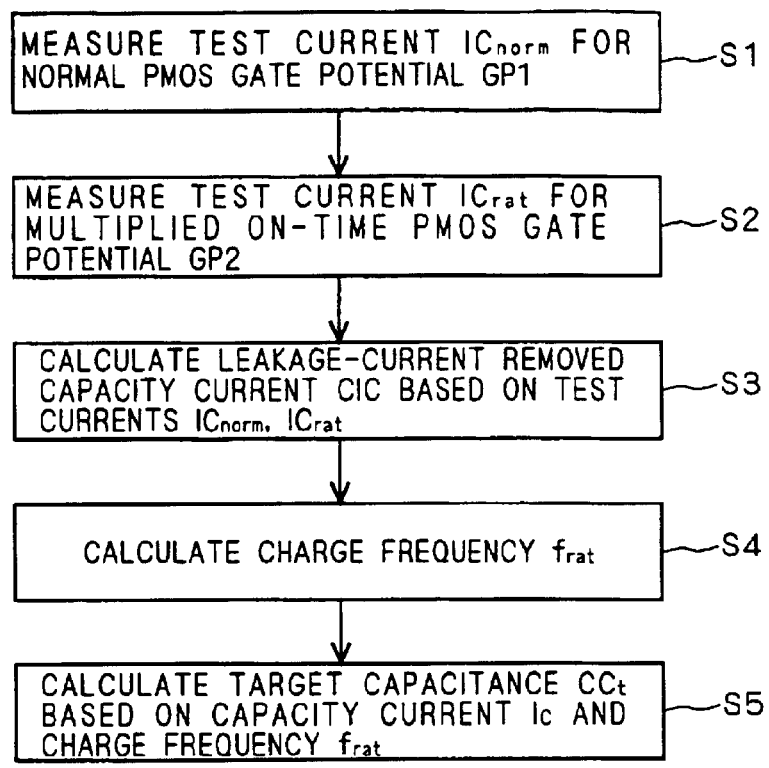
FIG. 1 is a sectional view showing a sectional structure of an MOS transistor for a conventional semiconductor device for CBCM.

FIG. 1 is a sectional view showing a sectional structure of an MOS transistor for a semiconductor device for CBCM according to the conventional art. As shown in FIG. 1, a well region 2 is formed on a silicon substrate 1, a channel stopper layer 3 is formed on the well region 2, and the well region 2 provided on the channel stopper layer 3 is isolated through an STI layer 15. In this specification, the well region 2 provided on the channel stopper layer 3 which is isolated through the STI layer 15 will be referred to as a body region 16.

A source-drain region 4 (4') is selectively formed in a surface of the body region 16, and extension regions 5 and 5' are extended from tip portions of the source-drain regions 4 and 4' opposed to each other respectively, and pocket regions 6 and 6' are formed in peripheral regions of the extension regions 5 and 5'.

A gate insulating film 7 is formed between the source-drain regions 4 and 4' including the extension regions 5 and 5' and a gate electrode 8 is formed on the gate insulating film 7. More specifically, the extension regions 5 and 5' and the source-drain regions 4 and 4' are formed to interpose the body region 16 (channel region) provided under the gate electrode 8.

First offset insulating films 11 and 11' are formed on both side surfaces of the gate electrode 8, second offset insulating films 12 and 12' are formed on side surfaces of the first offset insulating films 11 and 11' and a part of the source-drain regions 4 and 4', and sidewalls 13 and 13' are formed on side surfaces and surfaces of the second offset insulating films 12 and 12'. Moreover, cobalt silicide regions 10 and 10' are formed on surfaces of the source-drain regions 4 and 4' and a cobalt silicide region 9 is formed in an upper layer portion of the gate electrode 8.

A material of the first offset insulating film 11 (11') is a silicon oxide film, a silicon oxide nitride film, a TEOS film or the like. Moreover, a material of the second offset insulating film 12 (12') is a silicon oxide film, a silicon oxide nitride film, a TEOS film or the like. A material of the sidewall 13 (13') is a silicon oxide film, a silicon oxide nitride film, a TEOS film, a silicon nitride film or the like.

In FIG. 1, a conductivity type is not specifically shown. The well region 2 and the pocket region 6 (6') have a first conductivity type, the source-drain region 4 and the extension region 5 have a second conductivity type, and one of the first and second conductivity types is applied to a structure of an N type and the other conductivity type is applied to a structure of a P type.

The factor of a gate offleak includes (1) a junction leakage between the pocket region 6 and the extension region 5, (2) a junction leakage between the source-drain region 4 (the extension region 5) and the body region 16 (the well region 2 and the silicon substrate 1), and (3) a gate tunnel current between a drain and a gate. A structure of an MOSFET for reducing the leakages will be described below.

(First Mode)

Figure 2:
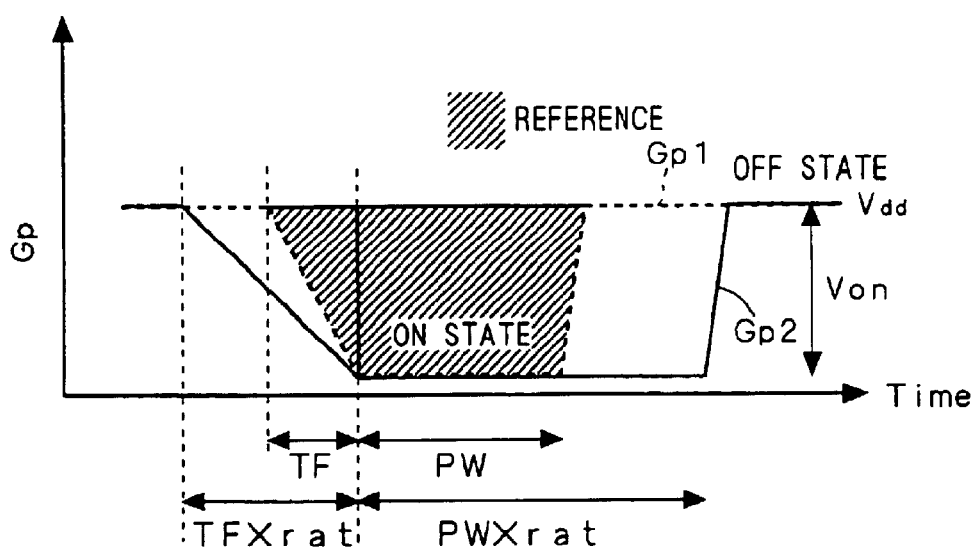
FIG. 2 is a sectional view showing a structure of a first mode in an MOS transistor for a semiconductor device for CBCM according to a first embodiment of the present invention.
Figure 33:
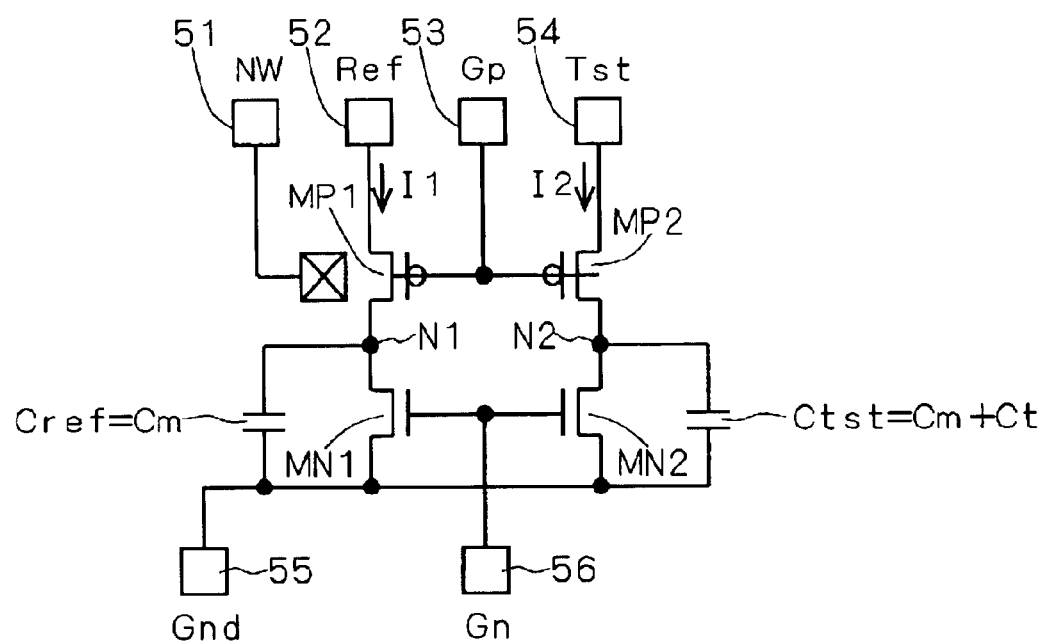
FIG. 33 is a circuit diagram showing a structure of a conventional circuit for CBCM.
Figure 34:
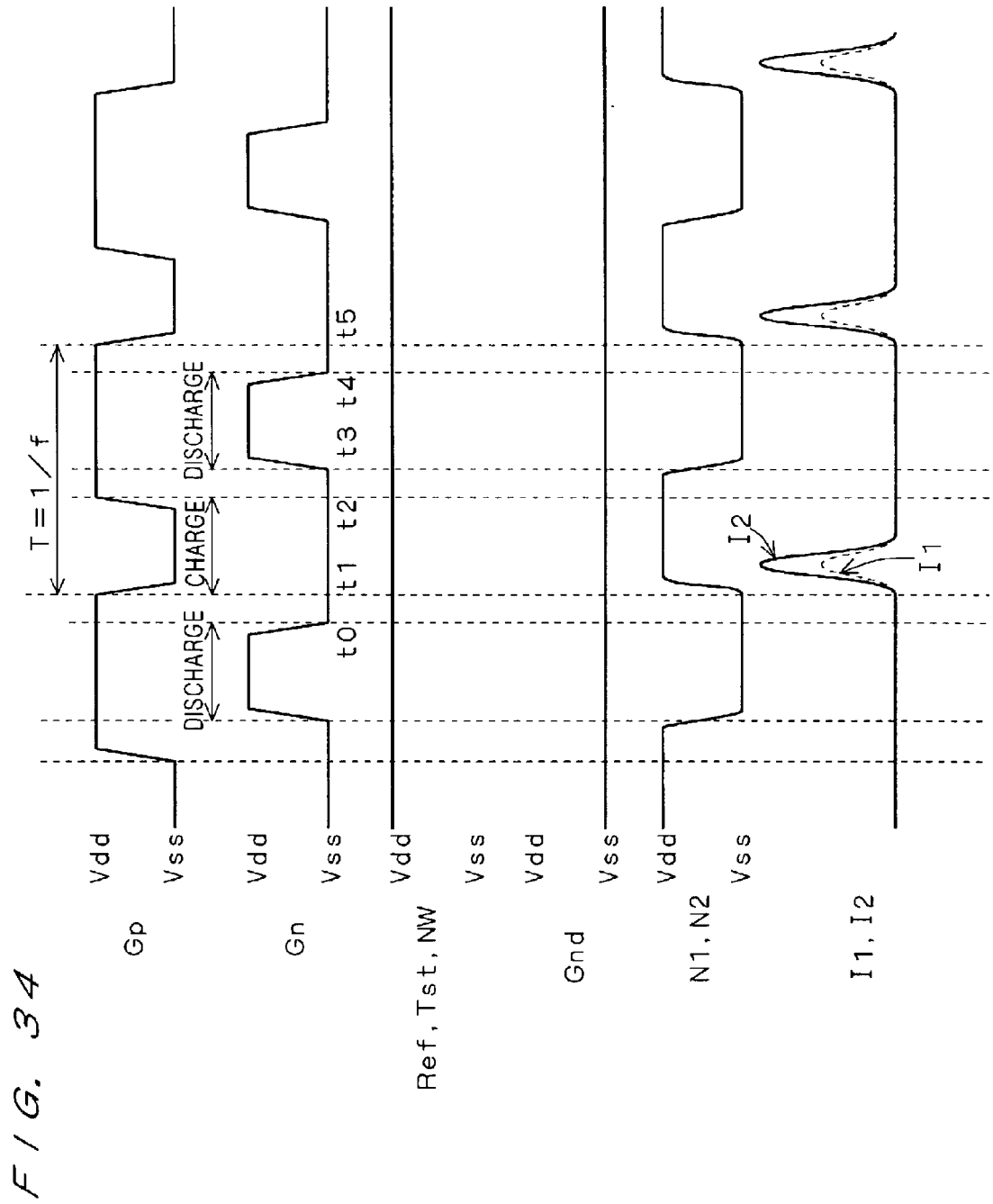
FIG. 34 is a timing chart showing an operation of the circuit for CBCM in FIG. 33.

FIG. 2 is a sectional view showing a structure of a first mode in an MOS transistor for the semiconductor device for CBCM according to the first embodiment of the present invention. The MOS transistor shown in FIG. 2 is used as at least one of PMOS transistors MP1 and MP2 and NMOS transistors MN1 and MN2 in FIG. 33.

As shown in FIG. 2, the structure of the first mode eliminates the presence of the pocket region 6 in the conventional structure shown in FIG. 1. More specifically, the body region 16 is characterized by an impurity concentration in a vicinal region of the source-drain region 4 (the extension region 5) which is equal to that in a non-vicinal region.

An impurity concentration of the pocket region 6 is higher than that of a channel region to be a surface region of the body region 16 provided under the gate insulating film 7. By eliminating the pocket region 6, therefore, a junction concentration between the channel region to be the surface region of the body region 16 and the extension region 5 is decreased so that an electric field strength applied to the junction is reduced. A BTBT (band to band tunnel), a TAT (trap assisted tunnel) or the like which is a pocket-extension junction leakage is suppressed with a reduction in the electric field strength. As a result, it is possible to obtain an advantage that a leakage current is reduced.

(Second Mode)

Figure 3:
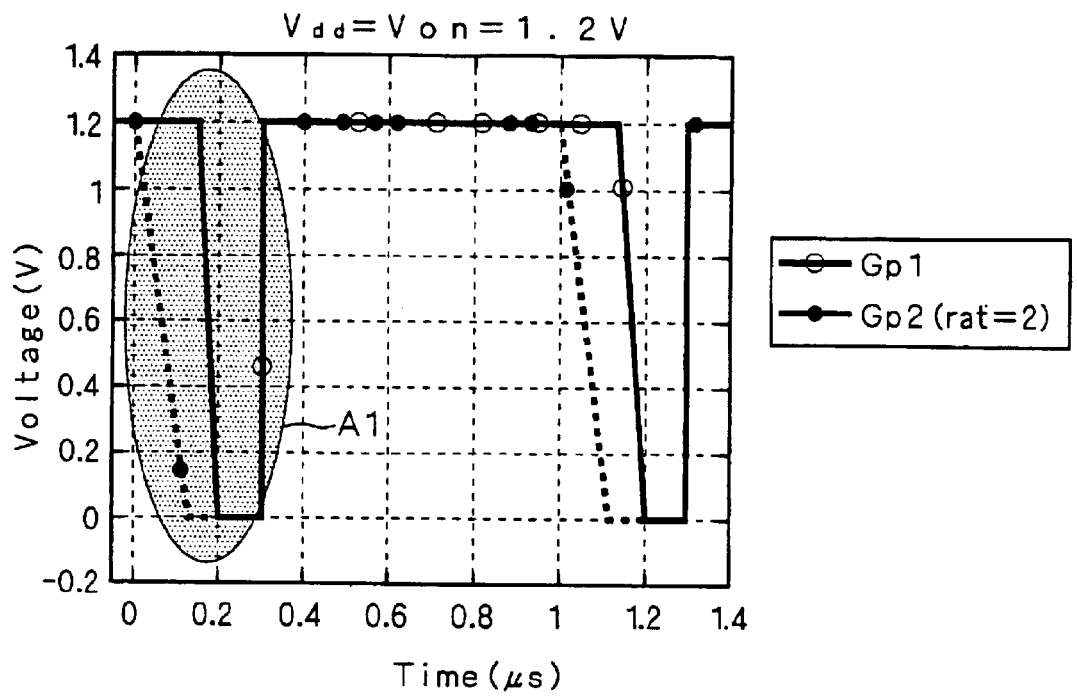
FIG. 3 is a sectional view showing a structure of a second mode in the MOS transistor according to the first embodiment.

FIG. 3 is a sectional view showing a structure of a second mode in an MOS transistor for the semiconductor device for CBCM according to the first embodiment of the present invention. As shown in FIG. 3, a source-drain region 14 is formed in a single region according to the second mode. More specifically, an extension region 5 is not provided differently from the first mode.

In the structure according to the second mode shown in FIG. 3, the source-drain region 14 is formed in one region so as to be an N⁻ layer for an NMOSFET and a P⁻ layer for a PMOSFET.

The N⁻ layer and the P⁻ layer to form the source-drain region 14 have lower impurity concentrations than the impurity concentration of the extension region 5 according to the first mode shown in FIG. 2, and an impurity concentration of $10^{18}/cm^3$ or less is desirable.

In both cases in which the source-drain region 14 has N and P types, the impurity concentration has a relationship of (source-drain region 14)<(extension region 5)<(an impurity concentration in a region in which the source-drain region 4 overlaps with the extension region 5; approximately $10^{20}/cm^3$).

By reducing the impurity concentration of the source-drain region 14, a depletion layer width is increased between the source-drain region 14 and the body region 16. Therefore, a junction electric field is relieved. When the junction electric field is relieved, it is possible to obtain an advantage that a leakage current caused by a TAT (trap assisted tunnel) can be reduced.

As shown in FIG. 3, a cobalt silicide region is not provided on a surface of the source-drain region 14. Consequently, it is also possible to obtain an advantage that a leakage current flowing in the source-drain region 14 can be reduced.

(Third Mode)

Figure 4:
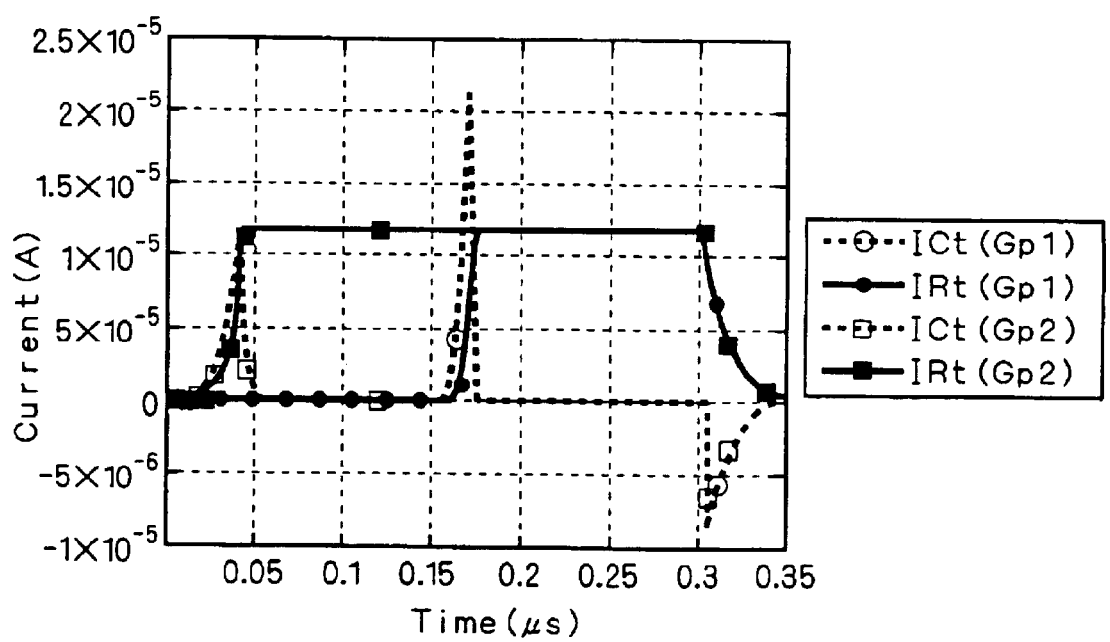
FIG. 4 is a sectional view showing a structure of a third mode in the MOS transistor according to the first embodiment.

FIG. 4 is a sectional view showing a structure of a third mode in an MOS transistor for the semiconductor device for CBCM according to the first embodiment of the present invention.

As shown in FIG. 4, in the structure according to the third mode, a source-drain region is formed by double diffusion of a first partial source-drain region 21 and a second partial source-drain region 22. The first and second partial source-drain regions 21 and 22 serve as first and second N⁻ regions for an NMOSFET and first and second P⁻ regions for a PMOSFET.

The first partial source-drain region 21 is formed in the same manner as the source-drain region 14 of the second mode shown in FIG. 3, and an implantation energy is more increased to implant an impurity ion into the second partial source-drain region 22 than that in the formation of the first partial source-drain region 21. Consequently, the second partial source-drain region 22 is formed close to a channel stopper layer 3 region more deeply than the first partial source-drain region 21.

Figure 5:
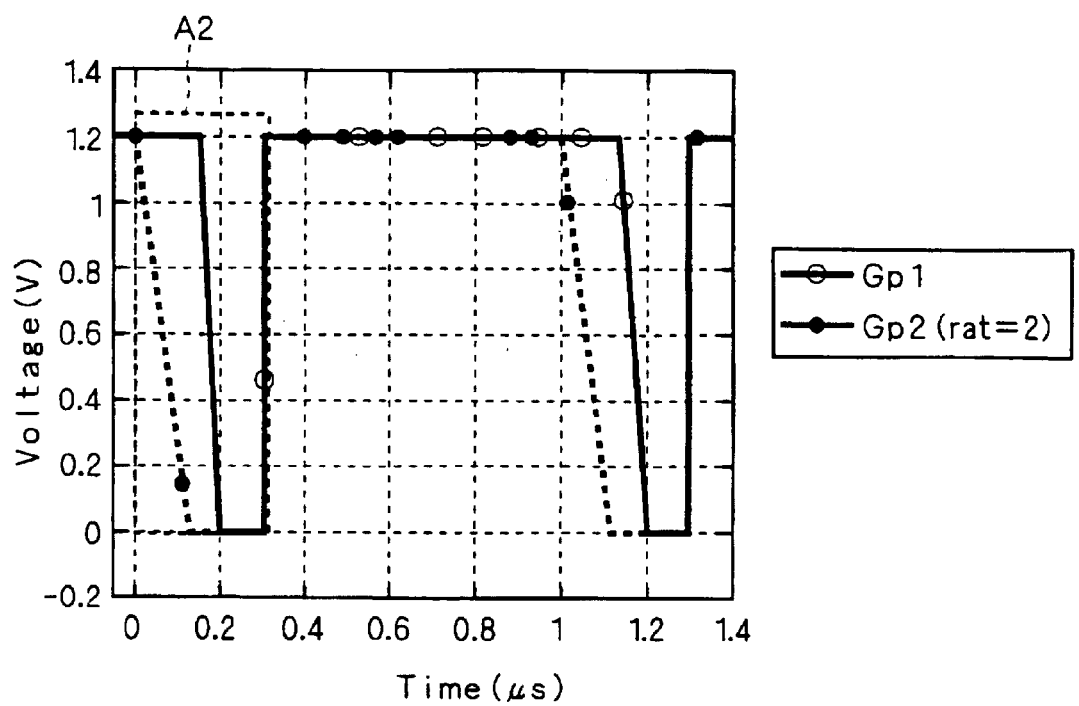
FIG. 5 is a chart showing an impurity concentration distribution in an A—A section of FIG. 4.

FIG. 5 is a chart showing an impurity concentration distribution in an A—A section of FIG. 4. FIG. 5 shows an example of an NMOS transistor. More specifically, the first and second partial source-drain regions 21 and 22 have an N type, and a well region 2 (a body region 16) and a silicon substrate 1 have a P type. Moreover, a first N-type impurity concentration CN1 denotes an impurity concentration of the first partial source-drain region 21 according to the third mode (=the source-drain region 14 according to the second mode), and a second N-type impurity concentration CN2 denotes an impurity concentration of the second partial source-drain region 22 according to the present mode. A P-type impurity concentration CP denotes a P-type impurity concentration in a silicon substrate 1, a well region 2, a channel stopper layer 3 and a body region 16.

As shown in FIG. 5, a junction concentration of a junction JC2 in the case of the third mode in which the second partial source-drain region 22 is formed (the structure shown in FIG. 4) is lower than that of a junction JC1 in the case of the second mode in which a source-drain region is formed by only the source-drain region 14 (the structure shown in FIG. 3). Therefore, when a reverse bias is applied between the source-drain region and the substrate, a width of a depletion layer provided around the junction JC2 is increased beyond the junction JC1 and an electric field strength is also reduced in the vicinity of the junction. It is possible to obtain an advantage that a leakage current caused by a TAT (trap assisted tunnel) is reduced with a decrease in a junction electric field.

(Fourth Mode)

Figure 6:
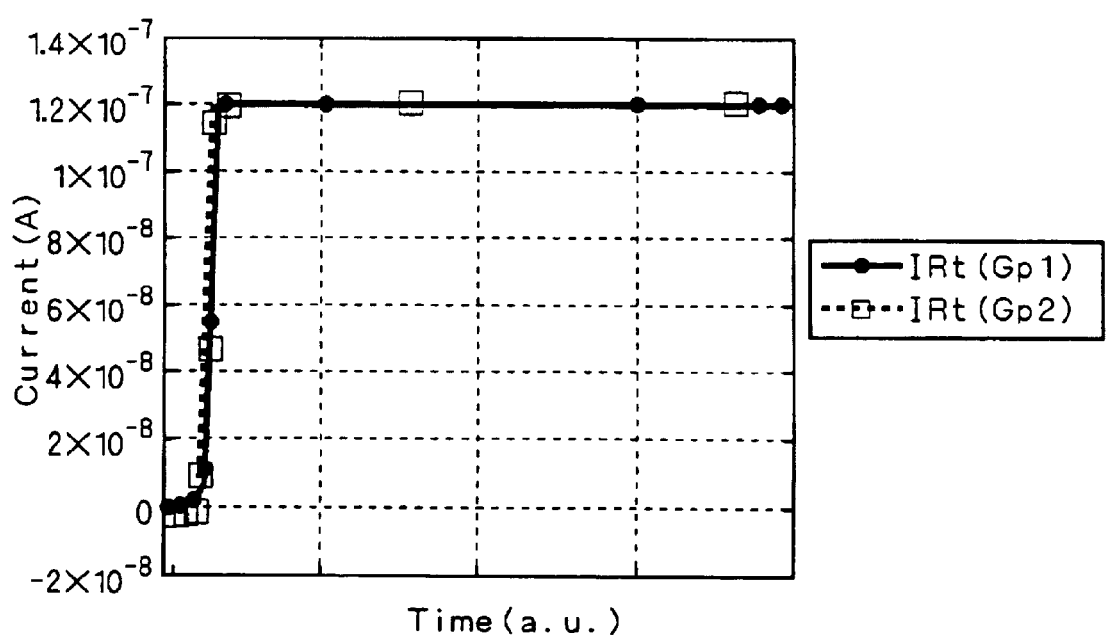
FIG. 6 is a sectional view showing a structure of a fourth mode in the MOS transistor according to the first embodiment.

FIG. 6 is a sectional view showing a structure of a fourth mode in an MOS transistor for the semiconductor device for CBCM according to the first embodiment of the present invention. As shown in FIG. 6, a counter dope region 23 is formed through pocket regions 6 and 6' on a surface of an active region between the source and drain regions 14 and 14'. Moreover, a punch-through stopper region 24 is provided under the pocket region 6 and the counter dope region 23 between the source-drain regions 14 and 14'. Other structures are the same as those in the first mode shown in FIG. 2.

In the structure, the counter dope region 23 has an N type, the pocket region 6 has a P type, the punch-through stopper region 24 has the P type and the channel stopper layer 3 has the P type in an NMOS transistor. In a PMOS transistor, the conductivity type is reversed.

In the structure according to the fourth mode shown in FIG. 6, at least one of MOSFETs for CBCM is of a buried channel type. A transistor of the buried channel type has an advantage that the influence of a noise (particularly, a flicker noise) is small. Since a microcurrent of 0.1 nA to 0.1 mA flows to a CBCM transistor, it is desirable that the influence of the noise should be small.

Moreover, while the presence of the pocket region 6 is optional, it is desirable that the pocket region 6 should not be present in order to reduce a leakage current between the pocket region 6 and the counter dope region 23.

(Fifth Mode)

Figure 7:
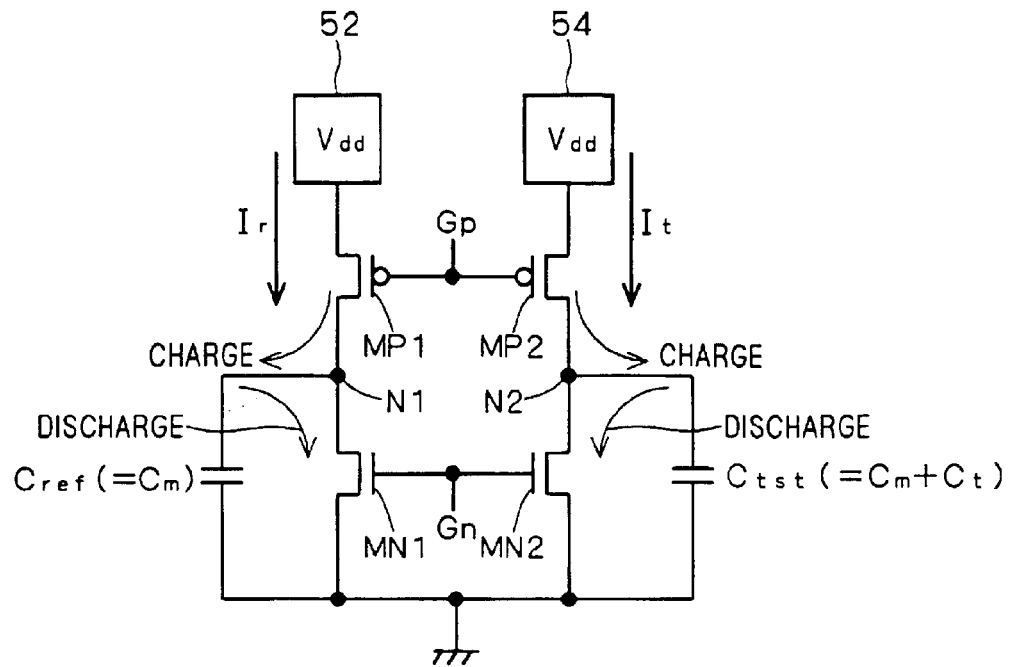
FIG. 7 is a sectional view showing a structure of a fifth mode in the MOS transistor according to the first embodiment.

FIG. 7 is a sectional view showing a structure of a fifth mode in an MOS transistor for the semiconductor device for CBCM according to the first embodiment of the present invention.

As shown in FIG. 7, a bottom N layer 17 is formed on a silicon substrate 1. In an NMOS region 45, a P well region 2p and a channel stopper layer 3p are formed on the bottom N layer 17 and an NMOS transistor is formed on the channel stopper layer 3p in the same manner as the structure shown in FIG. 1. On the other hand, in a PMOS region 46, an N well region 2n and an N-type channel stopper layer 3n are formed on the bottom N layer 17 and a PMOS transistor is formed on the N-type channel stopper layer 3n in the same manner as the structure shown in FIG. 1.

The structure of the fifth mode shown in FIG. 7 is characterized in that the bottom N layer 17 is formed under the P well region 2p and the N well region 2n in an active region of the transistor for CBCM and a positive electric potential is fixed by the bottom N layer 17 (such that a reverse bias is generated in a PN junction with the P well region 2p, for example). Moreover, the structure is characterized in that an electric potential of the N well region 2n is applied through the bottom N layer 17. In this case, a power supply potential Vdd is applied to the bottom N layer 17.

As compared with a structure in which the bottom N layer 17 is not formed, it is possible to obtain an advantage that a noise sent from the silicon substrate 1 is shielded by the bottom N layer 17. In the case in which a microcurrent (0.1 nA to 1 mA) flowing in the transistor is to be measured, therefore, the noise can be reduced. Consequently, it is possible to obtain an advantage that a capacitance value can be measured with high precision. Moreover, since the electric potential of the N well region 2n is applied from the bottom N layer 17, a contact region for fixing the electric potential of the N well region 2n does not need to be provided on a wafer surface. Correspondingly, it is possible to obtain an advantage that an occupation area can be reduced. Furthermore, while the structure of the MOS transistor in FIG. 1 is used for the structure of the MOS transistor in FIG. 7, the same structure is not restricted. The bottom N layer 17 according to the fifth mode may be provided in the structure of the MOS transistor according to each of the second to fourth modes shown in FIGS. 2 to 6.

Moreover, the electric potential of the N well region 2n may be fixed through the bottom N layer 17, and a contact for fixing the electric potential of the N well region 2n may be provided to fix the electric potential through the contact.

(Sixth Mode)

Figure 8:
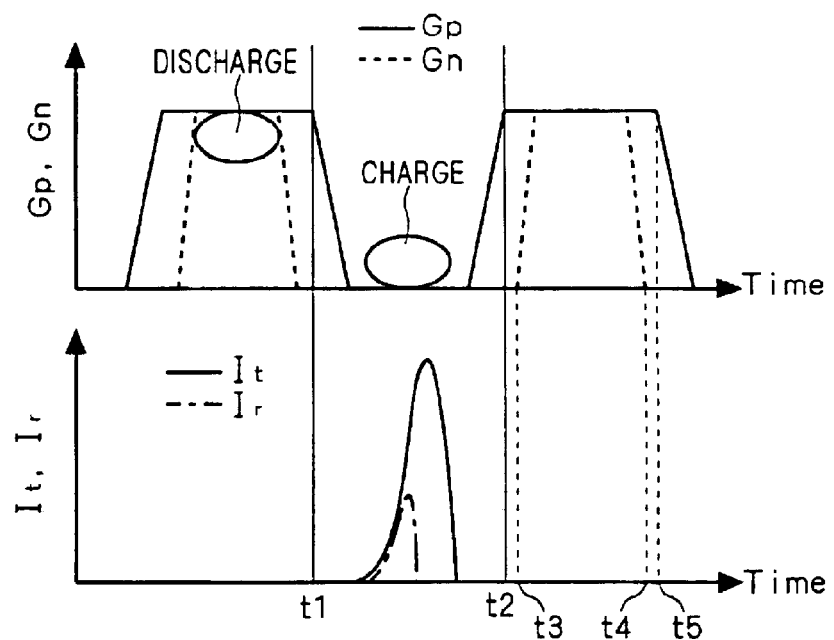
FIG. 8 is a sectional view showing a structure of a sixth mode in the MOS transistor according to the first embodiment.

FIG. 8 is a sectional view showing a structure of a sixth mode in an MOS transistor for the semiconductor device for CBCM according to the first embodiment of the present invention. As shown in FIG. 8, a bottom N layer 17a is provided in only a PMOS region 46 and a P well region 2p is directly formed on a silicon substrate 1 in an NMOS region 45. Other structures are the same as those in the fifth mode shown in FIG. 7.

The structure of the sixth mode shown in FIG. 8 is characterized in that the bottom N layer 17a is formed under only an N well region 2n to be an active region of the transistor for CBCM and an electric potential is fixed to be positive by the bottom N layer 17a. The structure according to the sixth mode can produce an advantage that a noise sent from the silicon substrate 1 is shielded as compared with a structure in which the bottom N layer 17a is not formed. In the case in which a microcurrent (0.1 nA to 0.1 mA) flowing in the transistor is to be measured, therefore, the noise is reduced. Therefore, it is possible to obtain an advantage that a capacitance value can be measured with high precision.

In the sixth mode, moreover, an electric potential of the P well region 2p may be optionally fixed through the silicon substrate (p-type substrate) 1. Furthermore, an electric potential of the N well region 2n may be optionally fixed through the bottom N layer 17a. In the case in which the electric potential is fixed, a contact for fixing an electric potential of a well does not need to be provided on a surface of the silicon substrate 1. Therefore, it is possible to produce an advantage that an occupation area can be reduced correspondingly.

(Seventh Mode)

Figure 9:
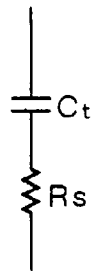
FIG. 9 is a sectional view showing a structure of a seventh mode in the MOS transistor according to the first embodiment.

FIG. 9 is a sectional view showing a structure of a seventh mode in an MOS transistor for the semiconductor device for CBCM according to the first embodiment of the present invention. As shown in FIG. 9, a bottom N layer 17b is provided in only an NMOS region 45 and an N well region 2n is formed on a silicon substrate 1 in a PMOS region 46. Other structures are the same as those in the fifth mode shown in FIG. 7.

The structure of the seventh mode shown in FIG. 9 is characterized in that a bottom N layer 17b is formed under only a P well region 2p to be an active region of the transistor for CBCM and an electric potential is fixed such that a PN junction with the P well region 2p has a reverse bias through the bottom N layer 17b. The structure according to the seventh mode can produce an advantage that a noise sent from the silicon substrate 1 is shielded as compared with the structure in which the bottom N layer 17b is not formed. Therefore, it is possible to produce an advantage that a capacitance value can be measured with high precision in the same manner as in the sixth mode.

As a matter of course, it is also possible to employ a structure in which a bottom P layer is formed in place of the bottom N layers 17, 17a and 17b in the fifth to seventh modes.

(Eighth Mode)

An eighth mode of the first embodiment has an object to reduce a gate tunnel leakage current of a CBCM transistor. When a gate insulating film has a thickness of 2 nm or less, a direct tunnel current becomes remarkable. Since the gate tunnel leakage current reduces measuring precision in CBCM, it is not desirable. Accordingly, it is desirable that a transistor including a gate insulating film having a great thickness should be used for the CBCM as compared with a logic transistor constituting a logic circuit comprising various logic gates. As an example, a gate insulating film of an I/O transistor for input and output has a greater thickness than the thickness of the gate insulating film of the logic transistor. Therefore, it can be proposed that the I/O transistor for input and output is used as an I/O transistor for CBCM.

In a semiconductor device in which three kinds of transistors, that is, an I/O transistor, a logic transistor and a memory cell transistor (an SRAM, a DRAM and a flash memory) are formed on the same chip, a relationship of {tox (Logic)<tox (I/O)<tox (M/C)} or {tox (Logic)≦tox (M/C) <tox (I/O)} is set in some cases, wherein the thicknesses of the gate insulating films of the transistors are represented by tox (I/O), tox (Logic) and tox (M/C) respectively. Since the gate insulating film has three thicknesses as described above, the semiconductor device is referred to as a triple oxide.

Figure 10:
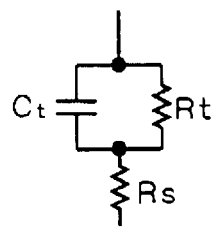
FIG. 10 is a diagram typically illustrating an example of an eighth mode according to the first embodiment.

FIG. 10 is a diagram typically illustrating an example of the eighth mode. As shown in FIG. 10, in the case in which a triple oxide semiconductor device 80 is to be formed by a logic transistor 81, an I/O transistor 82, a memory cell transistor 83 and a transistor 84 for CBCM, measuring precision in the CBCM can be enhanced by using, as the transistor 84 for CBCM, a transistor having a thickness of tox (I/O) or tox (M/C) (a transistor having the same gate insulating film as that in the I/O transistor or the memory cell transistor).

(Ninth Mode)

A ninth mode of the first embodiment has an object to reduce a mismatch of a CBCM transistor. One of the causes of the mismatch is a variation in a finished gate length in a process, for example, at a transfer step, a processing step or the like. A variation in an electrical characteristic of the transistor is increased with an increase in a rate of a variation in the gate length to the gate length. Therefore, it is desirable that the gate length of the transistor for CBCM should be greater than that of a logic transistor. As an example, it can be proposed that an I/O transistor is used for the CBCM.

Moreover, if an absolute value of a threshold voltage is greater, a rate of the variation is reduced. Therefore, it is desirable that a threshold voltage of the transistor for CBCM should be higher than that of the logic transistor.

(Tenth Mode)

Figure 11:
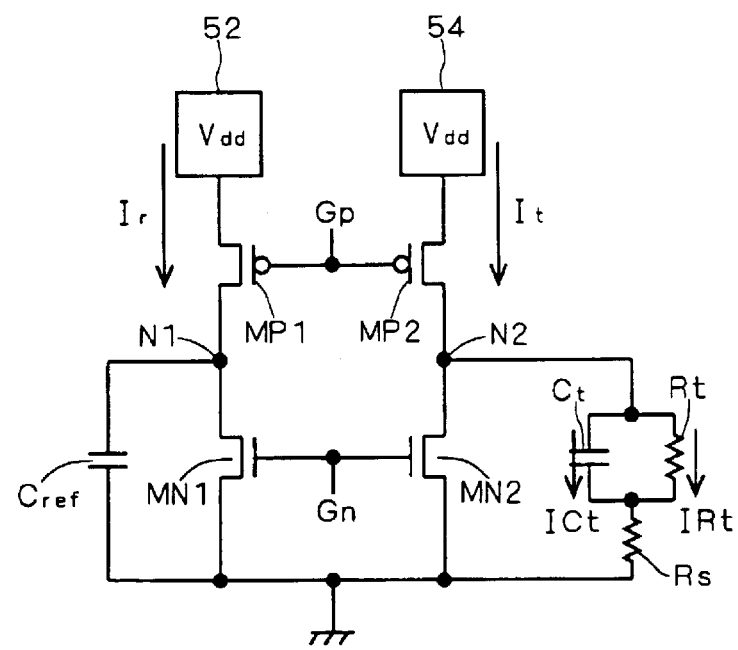
FIG. 11 is a diagram typically illustrating an example of a tenth mode according to the first embodiment.

FIG. 11 is a diagram illustrating a tenth mode of the first embodiment. As shown in FIG. 11, a CBCM circuit 93 for large capacitance measurement receives, as an operating power supply, a high power supply voltage HVdd which is higher than an internal power supply voltage IntVdd, and a CBCM circuit 94 for small capacitance measurement receives, as an operating power supply, a low power supply voltage LVdd which is lower than the internal power supply voltage IntVdd.

The internal power supply voltage IntVdd is output from an I/O circuit 87 for receiving a power supply potential Vdd and a ground potential Gnd from an external power supply input portion 85 and an external Gnd input portion 86. The high power supply voltage HVdd is output from a booster circuit 91 for raising the internal power supply voltage IntVdd, and the low power supply voltage LVdd is output from a step-down circuit 92 for dropping the internal power supply voltage IntVdd.

An ROM 88 and a logic circuit 89 are operated by using the internal power supply voltage IntVdd as an operating power supply, and a read/write memory 90 is operated by using, as an operating power supply, each of the internal power supply voltage IntVdd and the high power supply voltage HVdd. Examples of the read/write memory 90 include an SRAM, a DRAM, a flash memory, an FeRAM (Ferroelectric RAM), an MRAM (magnetic RAM) and the like.

Thus, the CBCM circuit 93 for large capacitance measurement according to the tenth mode of the first embodiment measures a capacitance by a CBCM method using the high power supply voltage HVdd as an operating power supply so that a capacitance value of a large capacitance can be measured, and the CBCM circuit 94 for small capacitance measurement can measure a capacitance by the CBCM method using the low power supply voltage LVdd as an operating power supply. Consequently, a leakage current can be suppressed effectively and the capacitance can be measured with high precision. The large capacitance implies 100 pF or more, for example.

Second Embodiment

A second embodiment of the present invention is characterized in that a source voltage switching portion is connected to a source of a transistor for CBCM. By regulating a source potential in the source switching portion, it is possible to obtain an advantage that a holding current can be reduced during a standby.

(First Mode)

Figure 12:
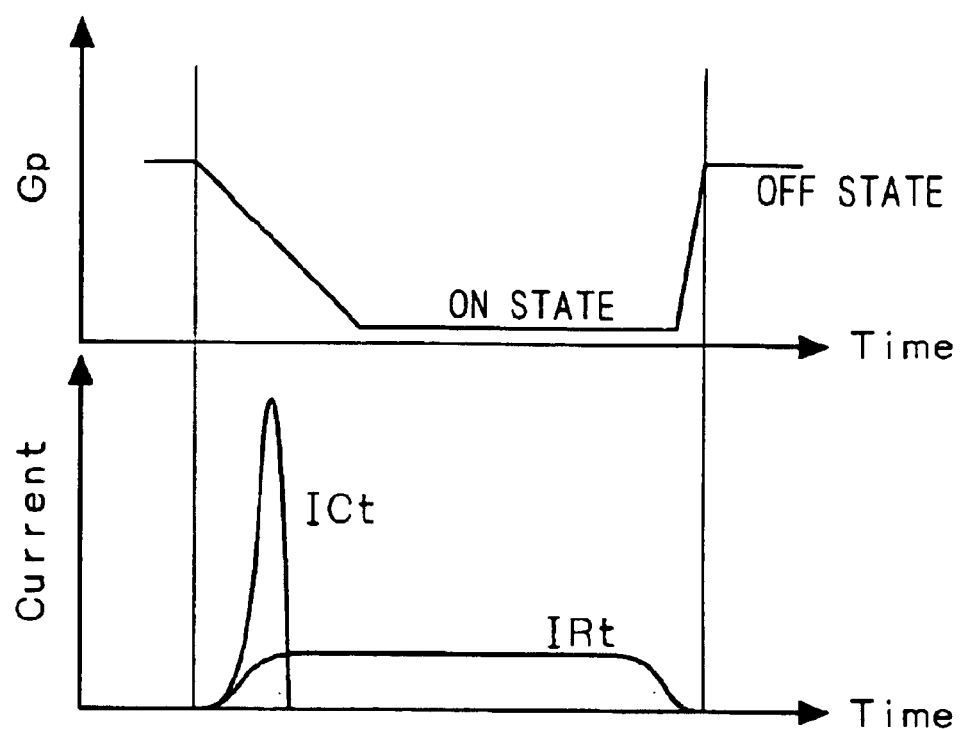
FIG. 12 is a sectional view showing a structure of a first mode in a semiconductor device having a circuit for CBCM according to a second embodiment.

FIG. 12 is a sectional view showing a structure of a first mode of a semiconductor device for CBCM according to the second embodiment of the present invention.

As shown in FIG. 12, the first mode presents a semiconductor device in which source voltage switching portions 31 to 34 to be power supply connection switching portions are provided in sources of NMOS transistors of a CBCMTEG (Test Element Group) 25.

The source voltage switching portion 31 controls to switch a source voltage of a PMOS transistor MP1, the source voltage switching portion 32 controls to switch a source voltage of an NMOS transistor MN1, the source voltage switching portion 33 controls to switch a source voltage of a PMOS transistor MP2, and the source voltage switching portion 34 controls to switch a source voltage of an NMOS transistor MN2. A clock $\phi 1$ controls the source voltage switching portions 31 and 33, and a clock $\phi 2$ controls the source voltage switching portions 32 and 34. The clocks $\phi 1$ and $\phi 2$ may have a timing which is identical or different.

By providing the source voltage switching portions 31 to 34, it is possible to obtain an advantage that a subthreshold current can be reduced and measuring precision in CBCM can be enhanced for a period in which a CBCM circuit is set in a standby state (a period in which all of the PMOS transistors MP1 and MP2 and the NMOS transistors MN1 and MN2 are to be turned OFF).

FIG. 13 is a circuit diagram showing a structure according to the first mode, specifically illustrating the source voltage switching portions 31 to 34 in FIG. 12. As shown in FIG. 13, a PMOS transistor MP3, an NMOS transistor MN3, a PMOS transistor MP4 and an NMOS transistor MN4 to be MOS transistors for power supply connection are provided as the source voltage switching portions 31 to 34.

The PMOS transistor MP3 has a source to receive a power supply potential Vdd, a drain connected to a drain of the PMOS transistor MP1, and a gate to receive the clock $\phi 1$. The PMOS transistor MP4 has a source to receive the power supply potential Vdd, a drain connected to a drain of the PMOS transistor MP2, and a gate to receive the clock $\phi 1$.

The NMOS transistor MN3 has a source grounded, a drain connected to a drain of the NMOS transistor MN1, and a gate to receive the clock $\phi 2$. The NMOS transistor MN4 has a source grounded, a drain connected to a drain of the NMOS transistor MN2, and a gate to receive the clock $\phi 2$.

Figure 14:
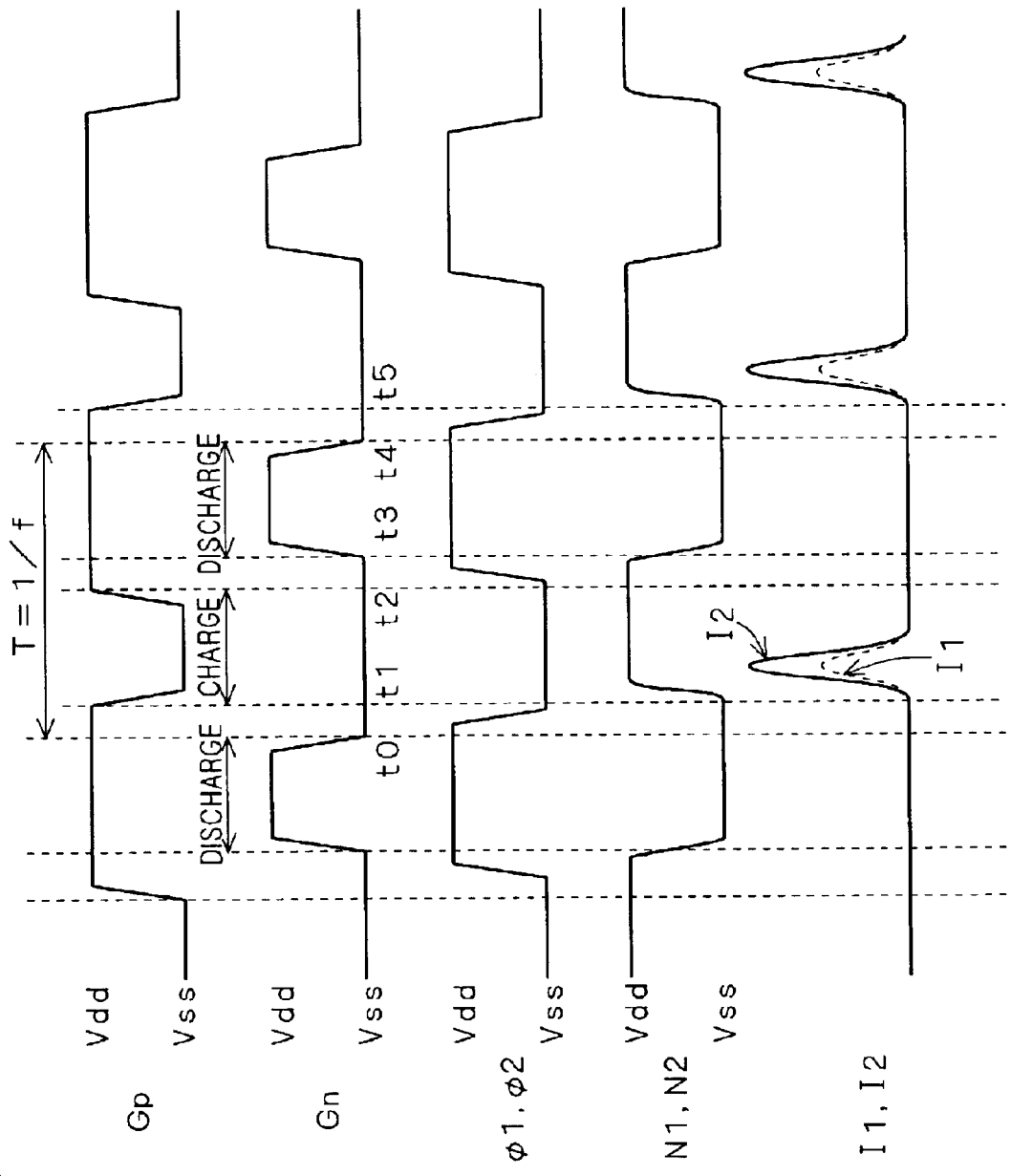
FIG. 14 is a timing chart showing an operation of the first mode according to the second embodiment illustrated in FIG. 13.

FIG. 14 is a timing chart showing an operation according to the first mode of the second embodiment illustrated in FIG. 13. Referring to FIG. 14 taking, as an example, the case in which the clocks $\phi 1$ and $\phi 2$ are identical, an operation at a time t0 to t5 will be described.

For the time t0 to t1, all of the PMOS transistors MP1 and MP2 and the NMOS transistors MN1 and MN2 are OFF. For this period, $\phi 1$ and $\phi 2$ are changed from "H" (=power supply potential Vdd) to "L" (=ground potential Vss), and the PMOS transistors MP3 and MP4 are turned ON and the NMOS transistors MN3 and MN4 are turned OFF.

Since the PMOS transistors MP3 and MP4 are turned ON, the source voltages of the PMOS transistors MP1 and MP2 constituting the CBCMTEG 25 are switched into the power supply potential Vdd.

For the time t1 to t2, a PMOS gate potential Gp is changed from "H" to "L" and both of the PMOS transistors MP1 and MP2 are turned ON. Moreover, an NMOS gate potential Gn and the clocks $\phi 1$ and $\phi 2$ are maintained to be "L". Therefore, charging is carried out over a reference capacitance Cref (=Cm) and a test capacitance Ctst (=Ct+Cm) with currents I1 and I2.

As a result, nodes N1 and N2 have electric potentials equal to the power supply potential Vdd. Before the time t2, the PMOS gate potential Gp is changed from "L" to "H" so that the PMOS transistors MP1 and MP2 are turned OFF.

For the time t2 to t3, both of the PMOS transistors MP1 and MP2 and the NMOS transistors MN1 and MN2 to constitute the CBCMTEG 25 are OFF. At this time, the clocks φ1 and φ2 are changed from "L" to "H" so that the PMOS transistors MP3 and MP4 are turned OFF and the NMOS transistors MN3 and MN4 are turned ON. However, since the NMOS transistors MN1 and MN2 are OFF, electric charges stored in the reference capacitance Cref and the test capacitance Ctst are not discharged for this period of time.

For the time t3 to t4, the NMOS gate potential Gn first rises from "L" to "H". At this time, the NMOS transistors MN1 and MN2 are turned ON. For this period, since the clocks φ1 and φ2 are "H", the NMOS transistor MN3 and the NMOS transistor MN4 are maintained to be ON. Moreover, since the PMOS gate potential Gp is maintained to be "H", the PMOS transistors MP1 and MP2 are maintained to be OFF. Accordingly, the electric charges stored in the reference capacitance Cref and the test capacitance Ctst are discharged so that the electric potentials of the nodes N1 and N2 are set to be the ground potential Vss. After the discharge is completed, the NMOS gate potential Gn is changed from "H" to "L" so that the NMOS transistors MN1 and MN2 are turned OFF.

For the time t4 to t5, the clocks φ1 and φ2 are changed from "H" to "L" so that the NMOS transistors MN3 and MN4 are turned OFF and the PMOS transistors MP3 and MP4 are turned ON. For this period, the PMOS gate potential Gp is maintained to be "H" and the NMOS gate potential Gn is maintained to be "L". Therefore, the NMOS transistors MN1 and MN2 and the PMOS transistors MP1 and MP2 are maintained to be OFF.

By the ON/OFF switching operations of the PMOS transistors MP3 and MP4, thus, the source potentials of the PMOS transistors MP1 and MP2 are set to be the power supply potential Vdd for only a charging period and a vicinal period thereof and are set into a floating state for other periods. By the ON/OFF switching operations of the NMOS transistors MN3 and MN4, the source potentials of the NMOS transistors MN1 and MN2 are set to be the ground potential Vss for only a discharging period and a vicinal period thereof and are set into the floating state for other periods. Therefore, it is possible to obtain an advantage that the holding current can be reduced in the standby state. Moreover, each of the source voltage switching portions 31 to 34 can be implemented with a comparatively simple structure in which one MOS transistor is provided.

(Second Mode)

Figure 15:
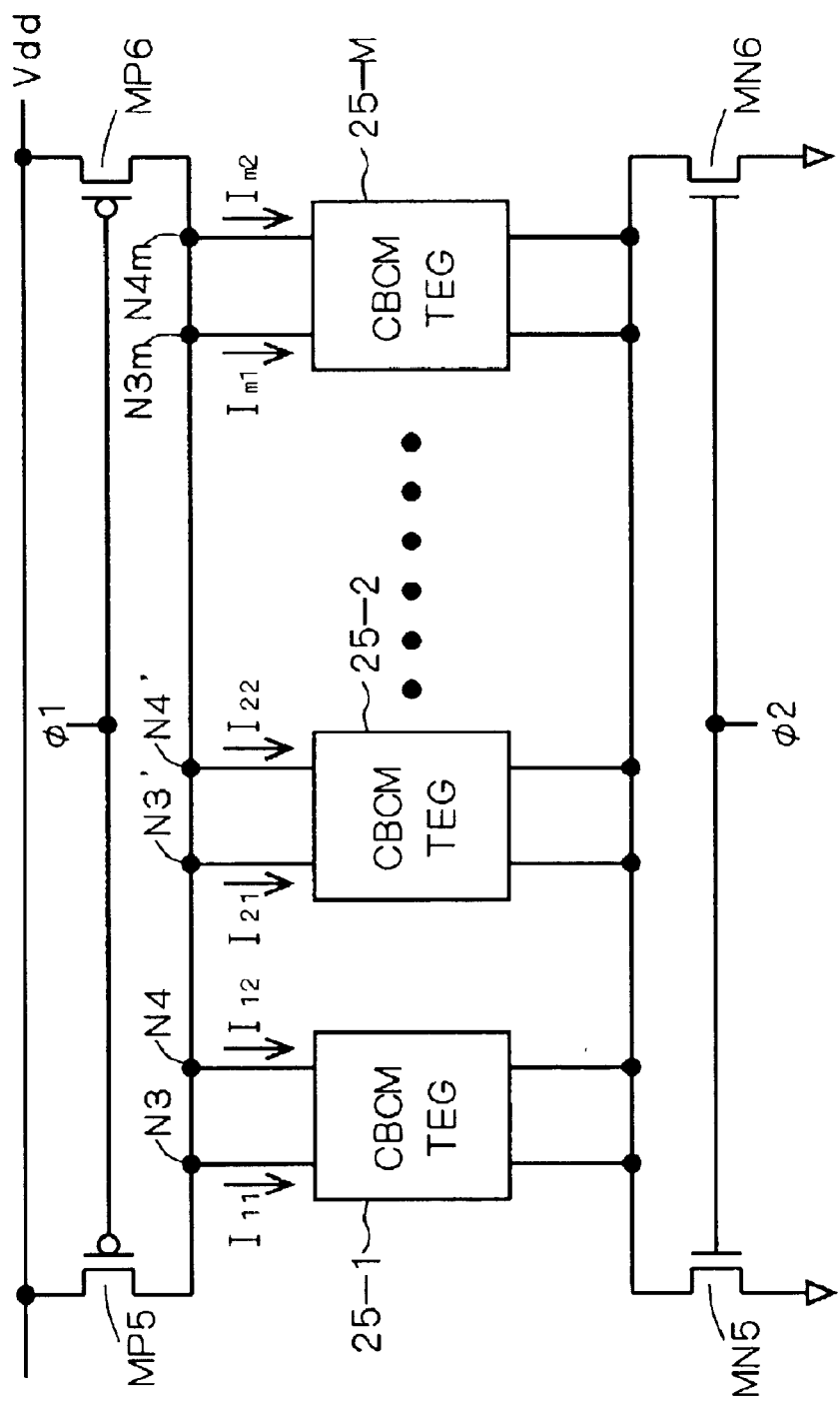
FIG. 15 is a circuit diagram showing a second mode according to the second embodiment.

FIG. 15 is a circuit diagram showing a second mode of the second embodiment. As shown in FIG. 15, in the case in which M ($\geq$2) CBCMTEGs 25-1 to 25-M are present, PMOS transistors MP5 and MP6 and NMOS transistors MN5 and MN6 to be source voltage switching portions are shared on the NMOS and PMOS sides, respectively.

More specifically, the PMOS transistor MP5 has a source to receive a power supply potential Vdd and a gate to receive a clock φ1. The PMOS transistor MP6 has a source to receive the power supply potential Vdd and a gate to receive the clock φ1. The PMOS transistors MP5 and MP6 have drains connected to a source of the PMOS transistor MP1 (in which currents Il1 to Im1 flow) and a source of the PMOS transistor MP2 (in which currents Il2 to Im2 flow) in each of the CBCMTEGs 25-1 to 25-M.

The NMOS transistor MN5 has a source grounded and a gate to receive a clock φ2. The NMOS transistor MN6 has a source grounded and a gate to receive the clock φ2. The NMOS transistors MN5 and MN6 have drains connected to sources of the NMOS transistors MN1 and MN2 in each of the CBCMTEGs 25-1 to 25-M.

In the second mode, thus, the source voltage switching portions are common to a plurality of CBCMTEGs 25 so that the number of transistors to be used for the source voltage switching portions can be decreased. Consequently, it is possible to produce an advantage that an occupation area can be reduced. FIG. 15 shows an example of a structure and it is possible to employ other circuits in which source voltage switching portions are common to a plurality of CBCMTEGs.

(Third Mode)

Figure 16:
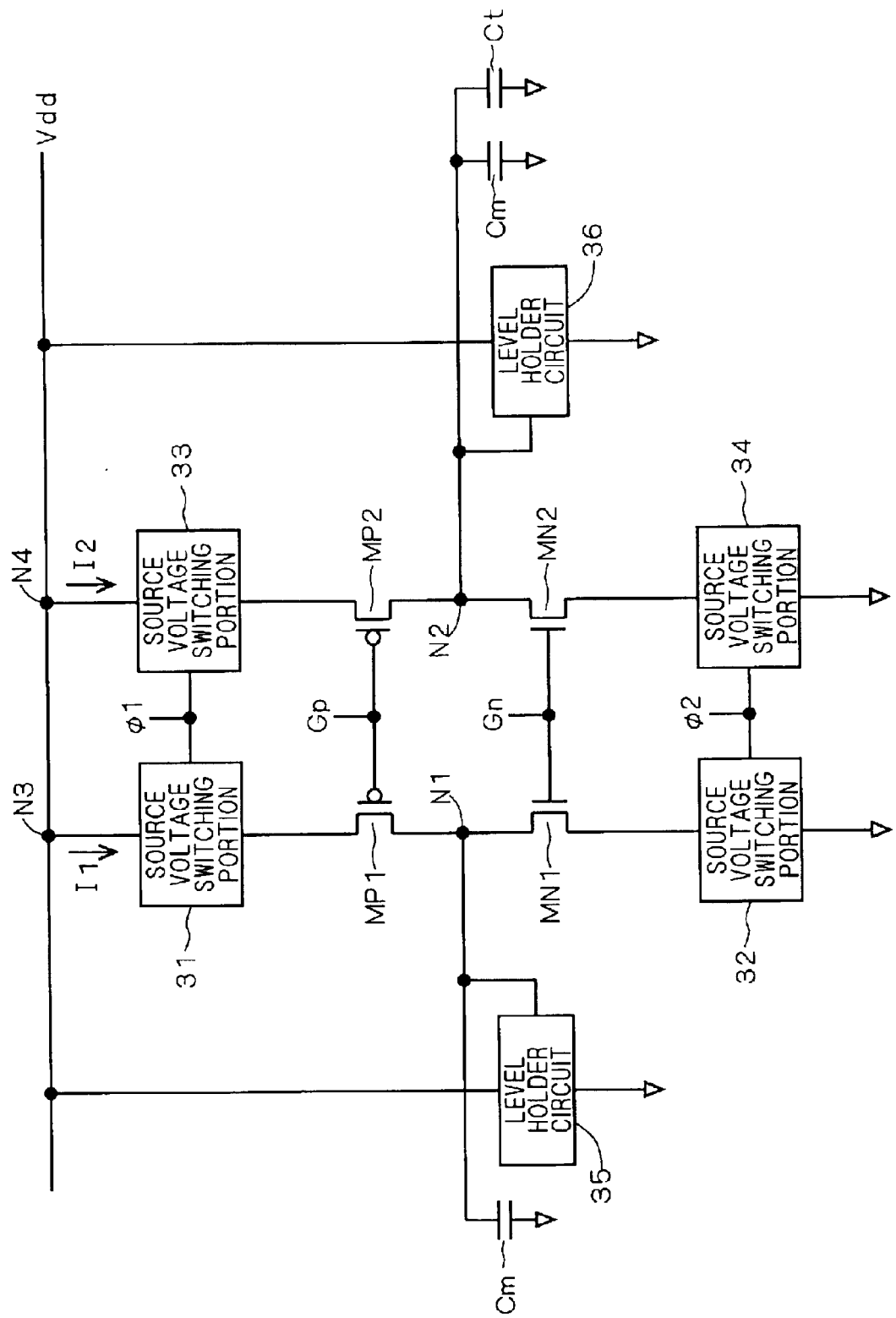
FIG. 16 is a circuit diagram showing a structure of a semiconductor device according to a third mode of the second embodiment.

FIG. 16 is a circuit diagram showing a structure of a semiconductor device according to a third mode of the second embodiment of the present invention. As shown in FIG. 16, a level holder circuit 35 is connected to a node N1 and a level holder circuit 36 is connected to a node N2 (a charge/discharge terminal). A power supply potential Vdd and a ground potential Vss are applied to the level holder circuits 35 and 36, respectively.

The level holder circuits 35 and 36 serve to hold electric potentials of the nodes N1 and N2 when a CBCM circuit is in a standby state (all of an NMOS transistor MN1, an NMOS transistor MN2, a PMOS transistor MP1 and a PMOS transistor MP2 are OFF), and to prevent the electric potentials of the nodes N1 and N2 from fluctuating due to a subthreshold current.

In the case in which frequencies of a PMOS gate potential Gp and an NMOS gate potential Gn are set to approximately 100 kHz to several MHz at time of measurement, it is preferable that an absolute value of a threshold voltage should be small for the following property of a transistor. However, there is a problem in that a subthreshold current is increased during level holding. The problem can be solved in the third mode.

Figure 17:
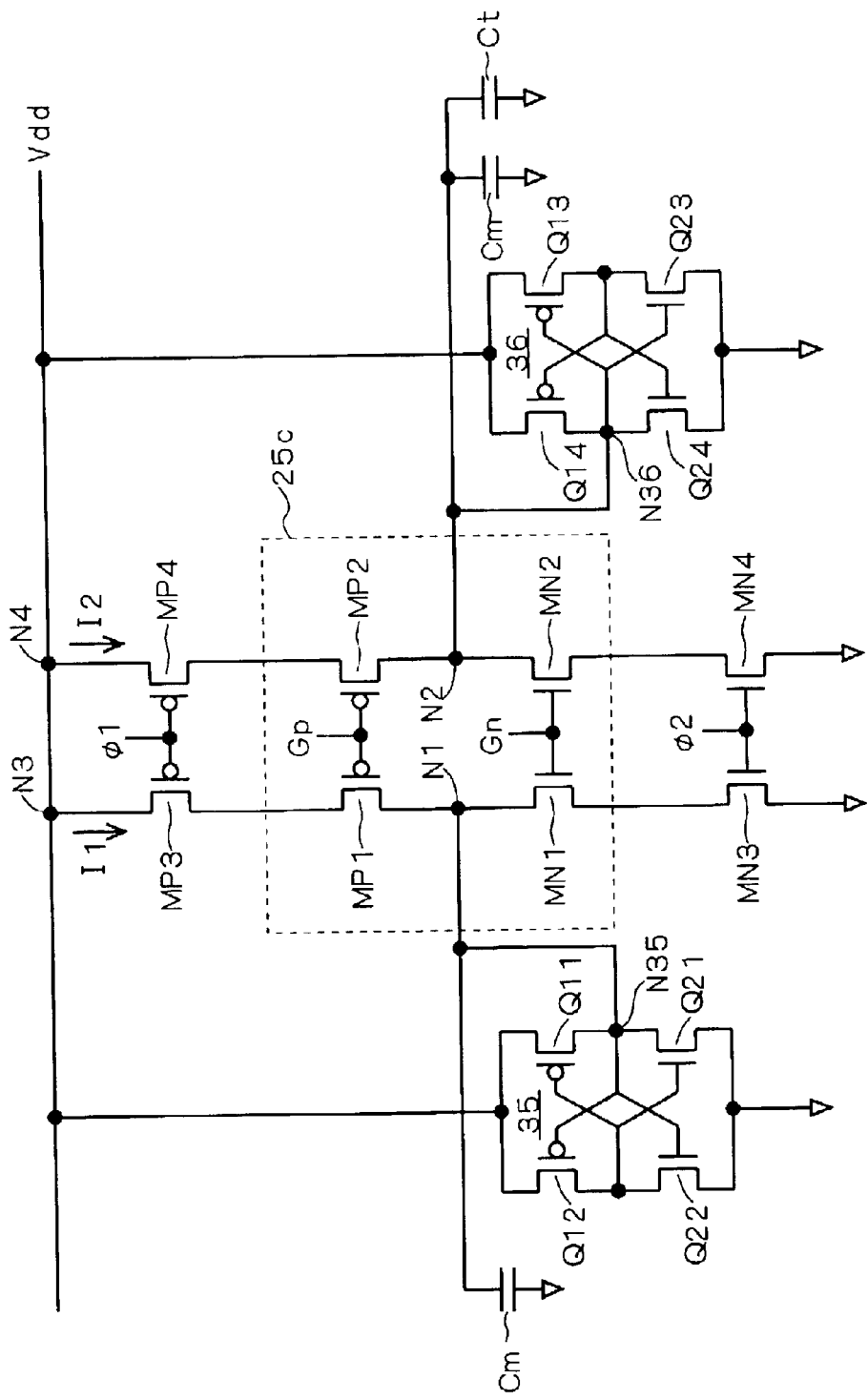
FIG. 17 is a circuit diagram showing a specific structure of a level holder circuit of the semiconductor device illustrated in FIG. 16.

FIG. 17 is a circuit diagram showing a specific structure of the level holder circuit of the semiconductor device illustrated in FIG. 16.

As shown in FIG. 17, the level holder circuit 35 is constituted by cross connecting a first inverter comprising a PMOS transistor Q11 and an NMOS transistor Q21 and a second inverter comprising a PMOS transistor Q12 and an NMOS transistor Q22. The PMOS transistors Q11 and Q12 have sources to receive the power supply potential Vdd and the NMOS transistors Q21 and Q22 have sources grounded. A node N35 provided between drains of the PMOS transistor Q11 and the NMOS transistor Q21 is connected to the node N1.

Similarly, the level holder circuit 36 is constituted by cross connecting a first inverter comprising a PMOS transistor Q13 and an NMOS transistor Q23 and a second inverter comprising a PMOS transistor Q14 and an NMOS transistor Q24. The PMOS transistors Q13 and Q14 have sources to receive the power supply potential Vdd and the NMOS transistors Q23 and Q24 have sources grounded. A node N36 provided between drains of the PMOS transistor Q13 and the NMOS transistor Q23 is connected to the node N2.

Moreover, a PMOS transistor MP3, an NMOS transistor MN3, a PMOS transistor MP4 and an NMOS transistor MN4 are used for source voltage switching portions 31 to 34 in the same manner as in the second mode shown in FIG. 13.

As shown in FIG. 17, the level holder circuits 35 and 36 constituted by inverter latches (flip-flops) of the first and second inverters are combined with the second mode. The NMOS transistor MN3, the NMOS transistor MN4, the PMOS transistor MP3 and the PMOS transistor MP4 connected to a power supply (the power supply potential Vdd and the ground potential Vss) in series serve as switches.

An operation of the circuit shown in FIG. 17 will be described below. The PMOS gate potential Gp, the NMOS gate potential Gn and timings of clocks φ1 and φ2 are the same as those of the first mode shown in FIG. 14.

First of all, the clock φ1 (and φ2) is (are) set to "L" and the PMOS transistor MP3 and the PMOS transistor MP4 are turned ON, and the PMOS gate potential Gp is set to "L" synchronously therewith. Since both of the PMOS transistors connected in series are turned ON, a reference capacitance Cref and a test capacitance Ctst are charged with a current and both of the electric potentials of the nodes N1 and N2 are set to the power supply potential Vdd. Next, the clock φ1 is changed to "H" to turn OFF the power supply. Then, the PMOS gate potential Gp is also set to "H". Before the clock φ1 is changed to "H", the NMOS gate potential Gn is "L" and the clock φ2 is also "L". Therefore, the NMOS transistors MN1 to MN4 are OFF.

If the absolute values of the threshold voltages of the NMOS transistors MN3 and MN4 and the PMOS transistors MP3 and MP4 are set to be higher such that the subthreshold current can be disregarded as compared with the absolute values of the threshold voltages of the NMOS transistors MN1 and MN2 and the PMOS transistors MP1 and MP2, the subthreshold current flowing to the circuit can be reduced to be disregarded in a standby state (a level holding period) in which all the transistors are OFF.

By setting the absolute values of the threshold voltages of the PMOS transistors Q11 to Q14 and the NMOS transistors Q21 to Q24 to constitute the level holder circuits 35 and 36 to be greater than those of the threshold voltages of the NMOS transistors MN1 and MN2 and the PMOS transistors MP1 and MP2, moreover, it is possible to suppress the subthreshold current flowing to the level holder circuits 35 and 36 for the level holding period.

Furthermore, the level holder circuits 35 and 36 hold the level of "H" or "L". Therefore, a transistor (a logic transistor) having a minimum dimension can be used to have a small size.

Next, the clock φ2 is changed from "L" to "H" to turn ON the NMOS transistors MN3 and MN4 and to connect the power supply (the ground potential Vss) to sources of the NMOS transistors MN1 and MN2. Then, when the NMOS gate potential Gn is changed from "L" to "H" to turn ON the NMOS transistors MN1 and MN2, electric charges stored in the test capacitance Ctst and the reference capacitance Cref are discharged so that the electric potentials of the nodes N1 and N2 are set to the ground potential Vss.

Subsequently, the clock φ2 is set to "L" to turn OFF the NMOS transistors MN3 and MN4, thereby turning OFF the power supplies of the NMOS transistor MN1 and the NMOS transistor MN2. Then, the NMOS gate potential Gn is changed from "H" to "L" to turn OFF the NMOS transistors MN1 and MN2 so that a standby state is brought. Before the clock φ2 is changed to "L", the clock φ1 is maintained to be "H", the PMOS gate potential Gp is maintained to be "H" and the PMOS transistors MP1 to MP4 are maintained to be OFF.

By setting the absolute values of the threshold voltages of the MOS transistors MP3, MP4, MN3 and MN4 constituting the source voltage switching portion to be greater than those of the threshold voltages of the transistors constituting the CBCM circuit as described above, it is possible to obtain an advantage that the subthreshold current for the level holding period of the level holder circuits 35 and 36 can be reduced and power consumption can be decreased.

In order to enhance the following property with an increase in a measured frequency, moreover, it is preferable that gate widths of the transistors of the source voltage switching portions 31 to 34 should be greater than those of the transistors constituting the CBCM circuit.

In the structure shown in FIG. 17, it is preferable that gate widths of the NMOS transistors MN3 and MN4 should be greater than those of the NMOS transistors MN1 and MN2 and gate widths of the PMOS transistors MP3 and MP4 should be greater than those of the PMOS transistors MP1 and MP2.

While FIGS. 12, 13 and 15 to 17 show the structure in which the power supply potential Vdd is applied to the nodes N3 (N3', N3m) and N4 (N4', N4m) in common, a terminal for the power supply potential Vdd may be provided separately for each of the nodes N3 and N4.

Third Embodiment

A semiconductor device according to a third embodiment of the present invention is characterized in that the same wiring connects a CBCM circuit to a pad for LCR meter measurement.

According to the semiconductor device in accordance with the third embodiment, since a capacitance of the same wiring can be measured by both a CBCM and an LCR meter, it is possible to eliminate a variation caused by a process, thereby taking a correlation thereof.

Conventionally, two wiring patterns are prepared and are connected to a circuit for the CBCM and a pad for the LCR meter separately such that the same capacitance can be obtained on a layout. Even if the same wiring capacitance can be obtained on the layout, a wiring capacitance is often varied slightly due to a variation caused by a wafer process in a wiring structure finished after the process is completed. In some cases in which a wiring structure having the same wiring capacitance on a layout is measured by the CBCM and the LCR meter, therefore, a value is varied. It is hard to decide whether a difference is caused by the process or a measuring method.

The semiconductor device according to the third embodiment can measure the same wiring structure by means of the CBCM and the LCR meter. Therefore, it is possible to obtain an advantage that a variation caused by the process can be eliminated in order to compare their measurement and an error caused by the measuring method can be evaluated with high precision.

(First Mode)

Figure 18:
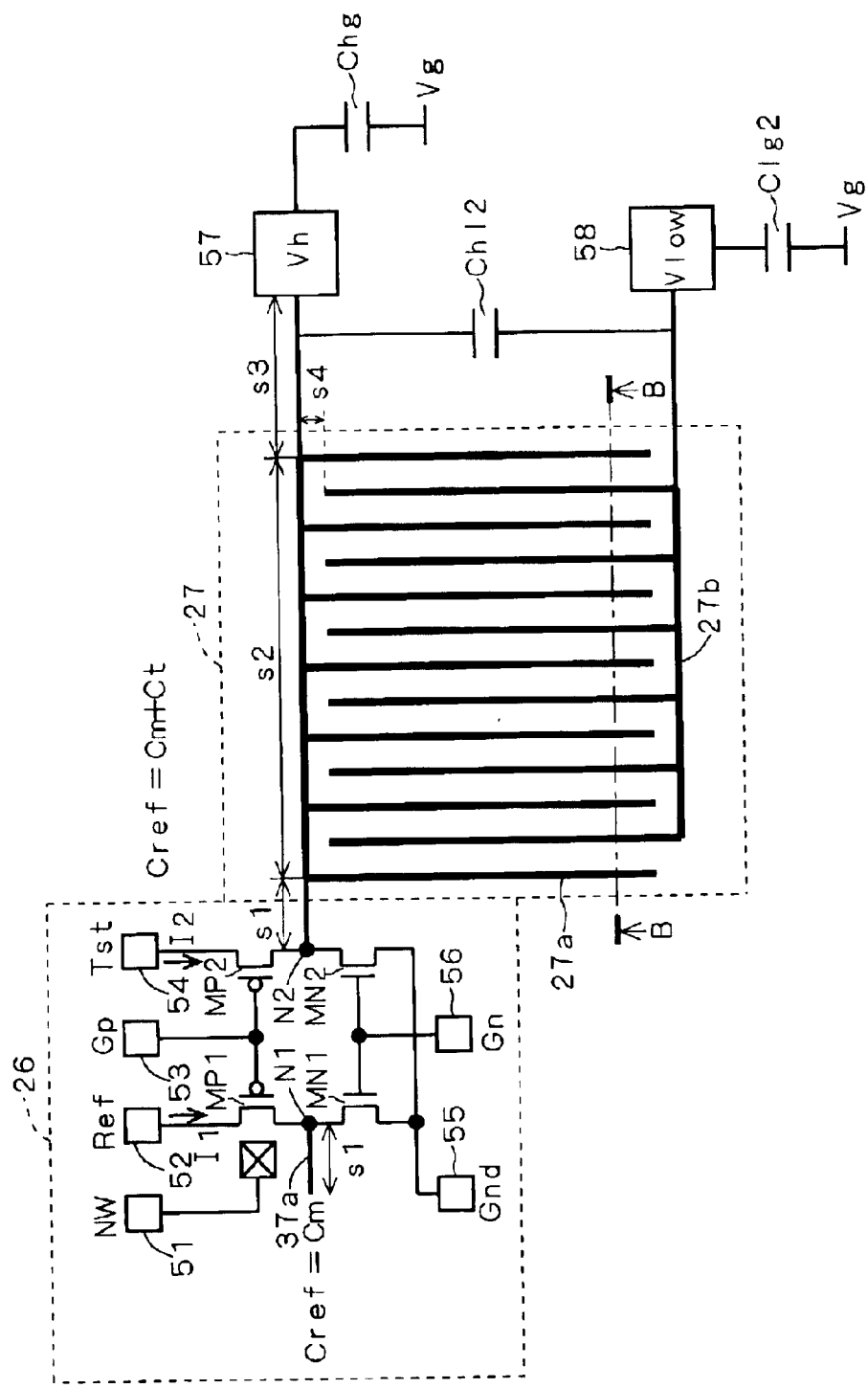
FIG. 18 is a diagram typically illustrating a first mode of a wiring capacitance measuring circuit in a semiconductor device according to a third embodiment.

FIG. 18 is a diagram typically illustrating a first mode of a wiring capacitance measuring circuit to be the semiconductor device according to the third embodiment of the present invention. As shown in FIG. 18, pads 57 and 58 for receiving an electric potential Vh and an electric potential Vlow are pads for an LCR meter, and pads 51 to 56 for receiving an electric potential NW, a reference potential Ref, a PMOS gate potential Gp, a test potential Tst, an electric potential Gnd and an NMOS gate potential Gn are pads of a CBCM circuit portion 26.

In the CBCM circuit portion 26 according to the first mode, a node N1 is provided with a dummy wiring capacitance pattern 37a having the same pattern dimension s1 as a pattern dimension s1 from a node N2 to a wiring capacitance pattern 27. Consequently, a capacitance other than the wiring capacitance pattern 27 is excluded from a measuring object to enhance measuring precision in a capacitance value. Other structures are the same as those shown in FIG. 33.

Figure 19:
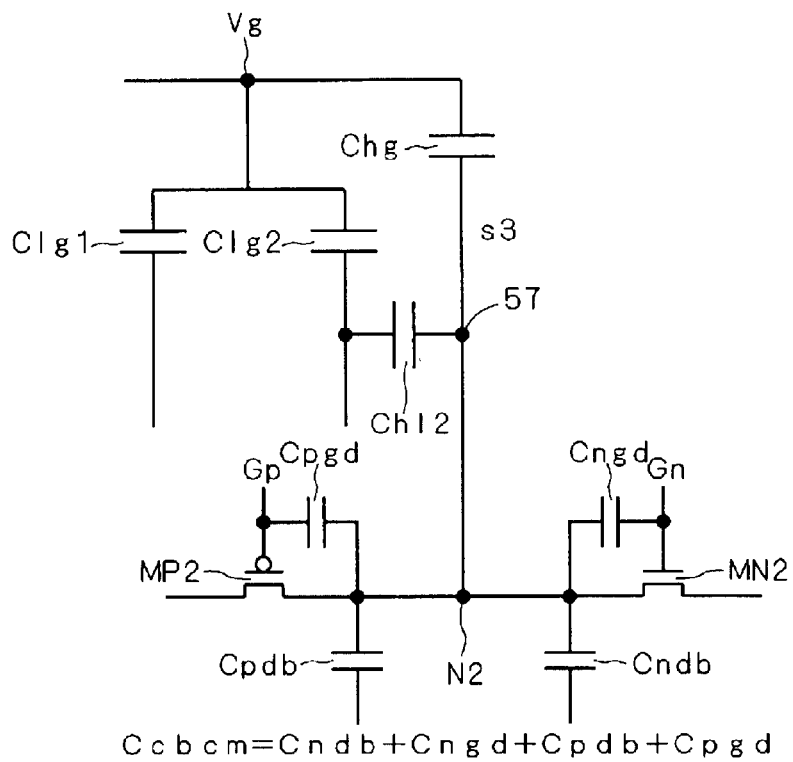
FIG. 19 is a circuit diagram showing an equivalent circuit between capacitances in the circuit illustrated in FIG. 16.
Figure 20:
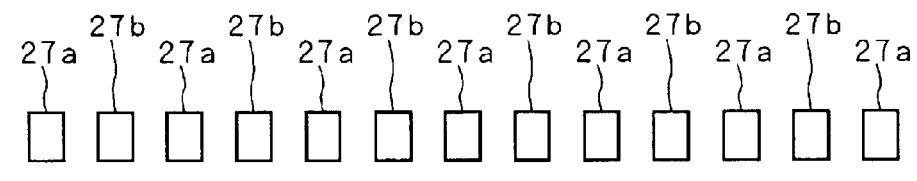
FIG. 20 is a diagram illustrating a B—B section in FIG. 18.

FIG. 19 is a circuit diagram showing an equivalent circuit having a connection relationship of each capacitance in FIG. 18. Moreover, FIG. 20 is a diagram illustrating a B—B section in FIG. 18. The wiring capacitance pattern 27 comprises partial wiring capacitance patterns 27a and 27b and has a comb-shaped structure seen from a top surface. If the comb-shaped wiring structure is cut along the B—B section in FIG. 18, the partial wiring capacitance patterns 27a and 27b are alternately cut out as shown in FIG. 20. A plate (or mesh-like) lower wiring 28 is provided under the comb-shaped layouts 27a and 27b and a wiring is not provided thereon. Moreover, the wirings are covered with an insulator, which is not shown in FIG. 20. With such a structure, a wiring capacitance of "line and space" can be measured.

Returning to FIG. 18, capacitances of the comb-shaped wiring formed by the partial wiring capacitance patterns 27a and 27b and the lower wiring 28 are represented by Clg1, capacitances of the pads 57 and 58 for the LCR meter and the lower wiring 28 are represented by Chg and Clg2 respectively, a capacitance around drains of the PMOS transistor MP2 and the NMOS transistor MN2 in the CBCM circuit portion 26 is represented by Ccbcm, and a wiring capacitance obtained by measurement through the pads 57 and 58 for the LCR meter is represented by Chl2, and each capacitance is connected as shown in the equivalent circuit diagram of FIG. 19.

More specifically, the capacitance Clg1 and the capacitance Clg2 have a parallel relationship as seen from the other electrode end Vg of the capacitance Chg and the capacitance Clg2 and a sum of Clg=Clg1+Clg2 is established. Moreover, the capacitance Chl2, the capacitance Chg and the capacitance Ccbcm are connected in parallel with each other and the capacitance Chg and the capacitance Clg are connected in series as seen from the pad 57 for the LCR meter. As shown in FIG. 19, the capacitance Ccbcm is a sum of a capacitance Cpdb (a capacitance between a drain of the PMOS transistor MP2 and a substrate), a capacitance Cpgd (a capacitance between a gate and the drain in the PMOS transistor MP2), a capacitance Cndb (a capacitance between a drain of the NMOS transistor MN2 and the substrate) and a capacitance Cngd (a capacitance between a gate and the drain in the NMOS transistor MN2).

Accordingly, the following equation (3) is established between a wiring capacitance Chl1 measured by a CBCM method and the capacitance described above.

$$Chl1 = Chl2 + \frac{Chg \times Clg}{Chg \times Clg} = Ccbcm \quad (3)$$

In the equation (3), moreover, it is supposed that the lower wiring 28 (the other electrode end Vg) is in a floating state. In FIG. 20, an electric potential of the lower wiring 28 may be fixed.

Figure 21:
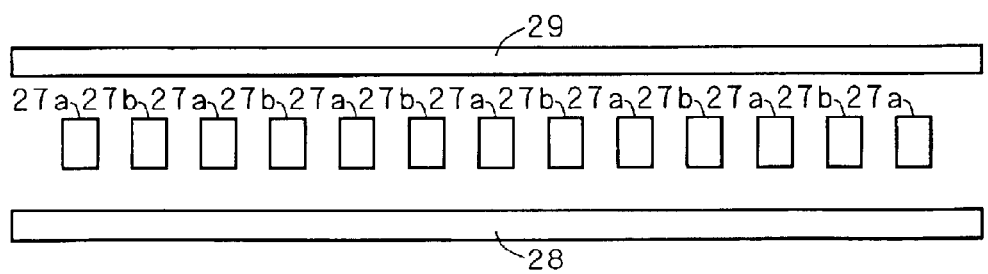
FIG. 21 is a diagram illustrating another wiring structure.

FIG. 21 is a diagram illustrating another wiring structure, showing the B—B section of FIG. 18 in the same manner as in FIG. 20. As shown in FIG. 21, an upper wiring 29 is formed on the partial wiring capacitance patterns 27a and 27b in addition to the lower wiring 28. Electrode plates to be the upper and lower layers (or mesh-like wirings) may be provided.

(Second Mode)

Figure 22:
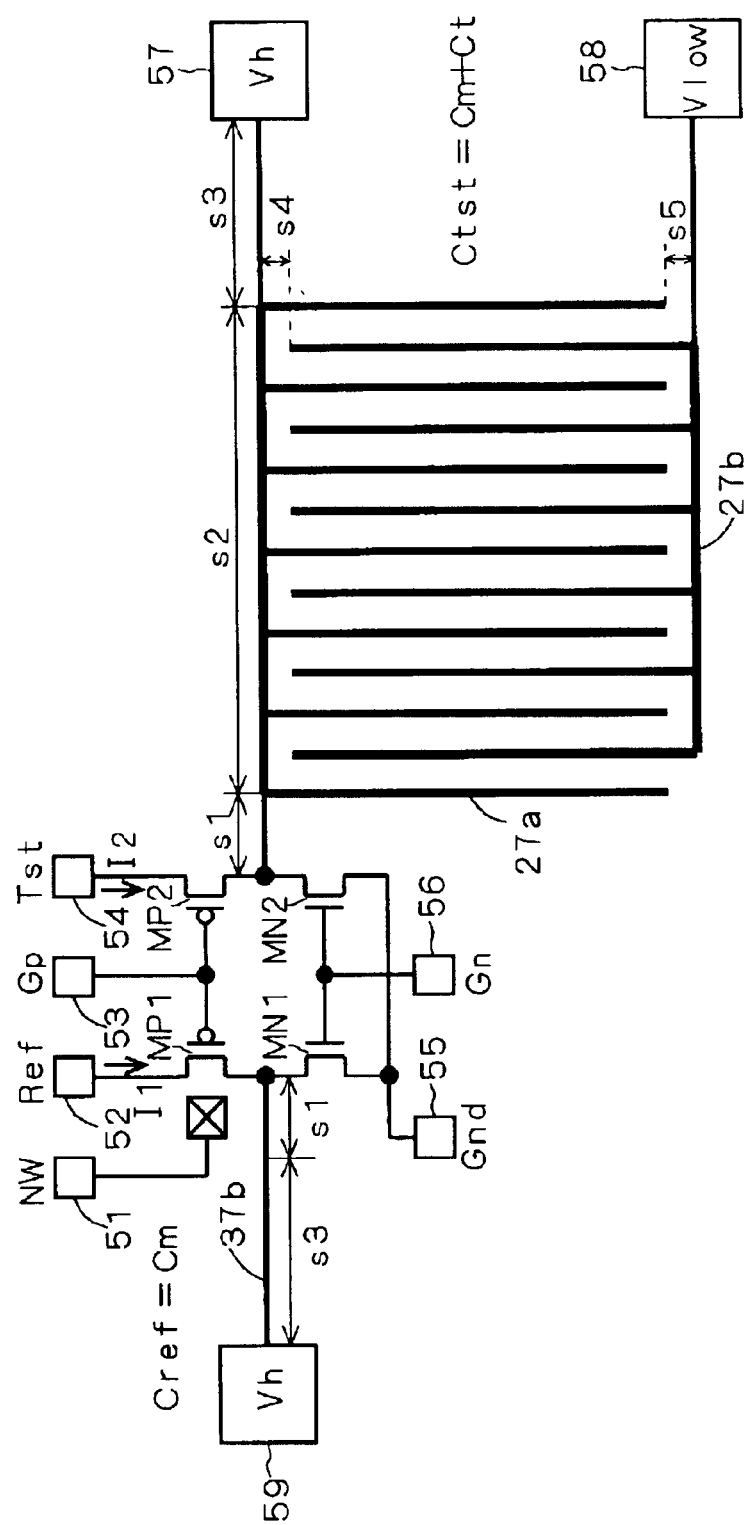
FIG. 22 is a diagram illustrating a second mode according to the third embodiment.

FIG. 22 is a diagram illustrating a second mode according to the third embodiment. In the second mode shown in FIG. 22, there are provided a dummy wiring capacitance pattern 37b having a dimension of (s1+s3) obtained by adding a pattern dimension s3 from a partial wiring capacitance pattern 27a to a pad 57 for an LCR meter to a pattern dimension s1 of the partial wiring capacitance pattern 27a and a dummy pad 59 equivalent to the pad 57 for the LCR meter. Consequently, it is possible to further enhance measuring precision in a capacitance value by excluding a capacitance other than a wiring capacitance pattern 27 from a measuring object.

(Third Mode)

Figure 23:
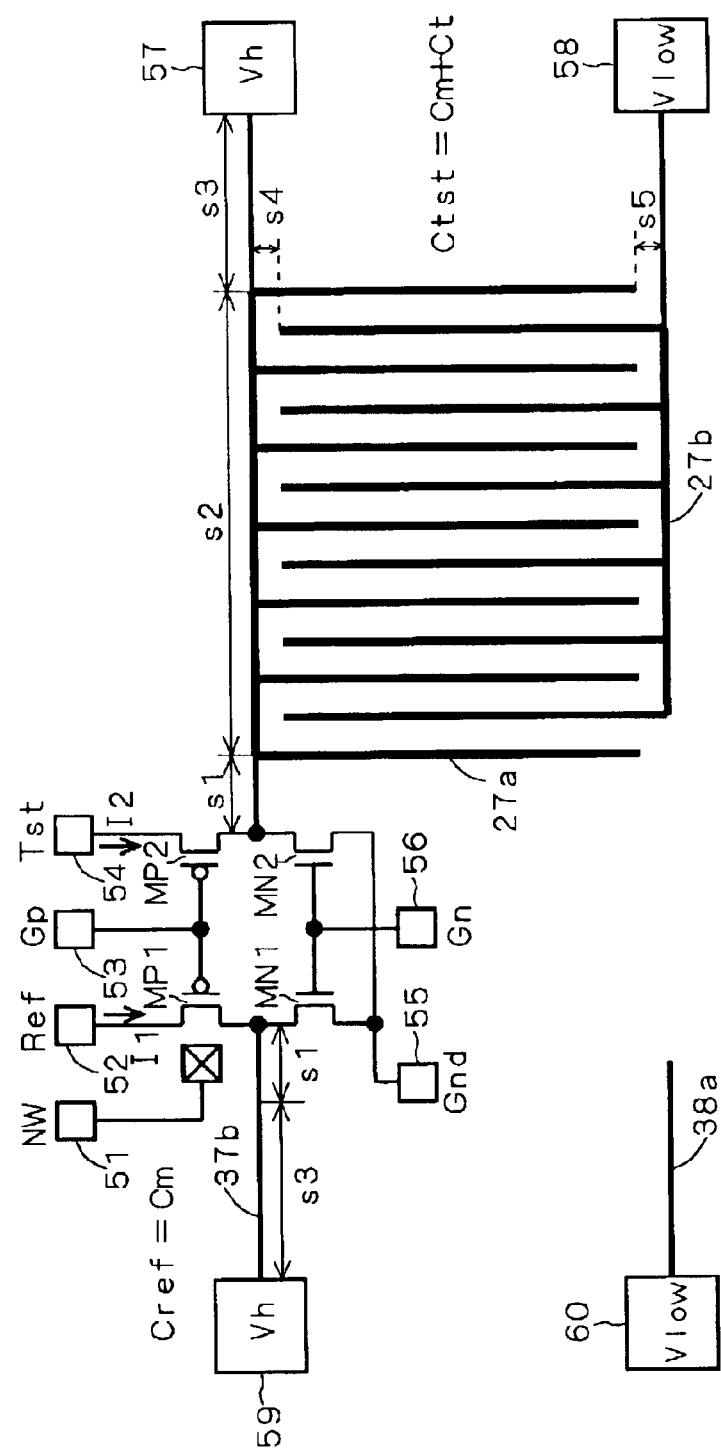
FIG. 23 is a diagram illustrating a third mode according to the third embodiment.

FIG. 23 is a diagram illustrating a third mode according to the third embodiment. In the third mode shown in FIG. 23, a dummy wiring capacitance pattern 38a having a pattern dimension s3 from a partial wiring capacitance pattern 27b to a pad 58 for an LCR meter and a dummy pad 60 equivalent to the pad 58 for the LCR meter are provided in addition to a dummy wiring capacitance pattern 37b having a pattern dimension of (s1+s3) and a dummy pad 59. Consequently, it is possible to further enhance measuring precision in a capacitance value by excluding a capacitance other than a wiring capacitance pattern 27 from a measuring object.

(Fourth Mode)

Figure 24:
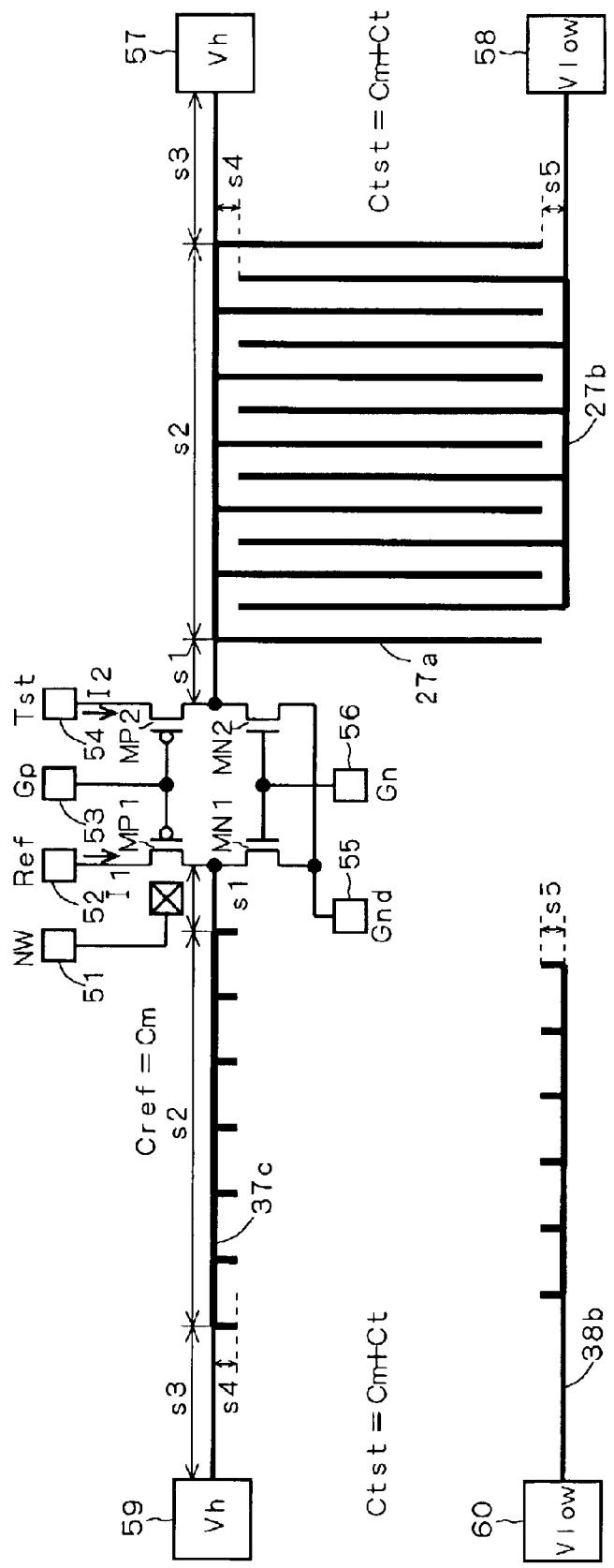
FIG. 24 is a diagram illustrating a fourth mode according to the third embodiment.

FIG. 24 is a diagram illustrating a fourth mode according to the third embodiment. In the fourth mode shown in FIG. 24, there are provided a dummy wiring capacitance pattern 37c having pattern dimensions s1 to s4 including a partial size (a pattern dimension of s2×s4) of the wiring capacitance pattern 27a which are common to the partial wiring capacitance pattern 27a, and a dummy wiring capacitance pattern 38b having pattern dimensions s2, s2 and s5 including a partial size (a pattern dimension of s2×s5) of the partial wiring capacitance pattern 27b which are common to the partial wiring capacitance pattern 27b. Consequently, it is possible to enhance measuring precision in a capacitance value still more than that in the third mode by excluding a capacitance other than the wiring capacitance pattern 27 from a measuring object.

(Fifth Mode)

Figure 25:
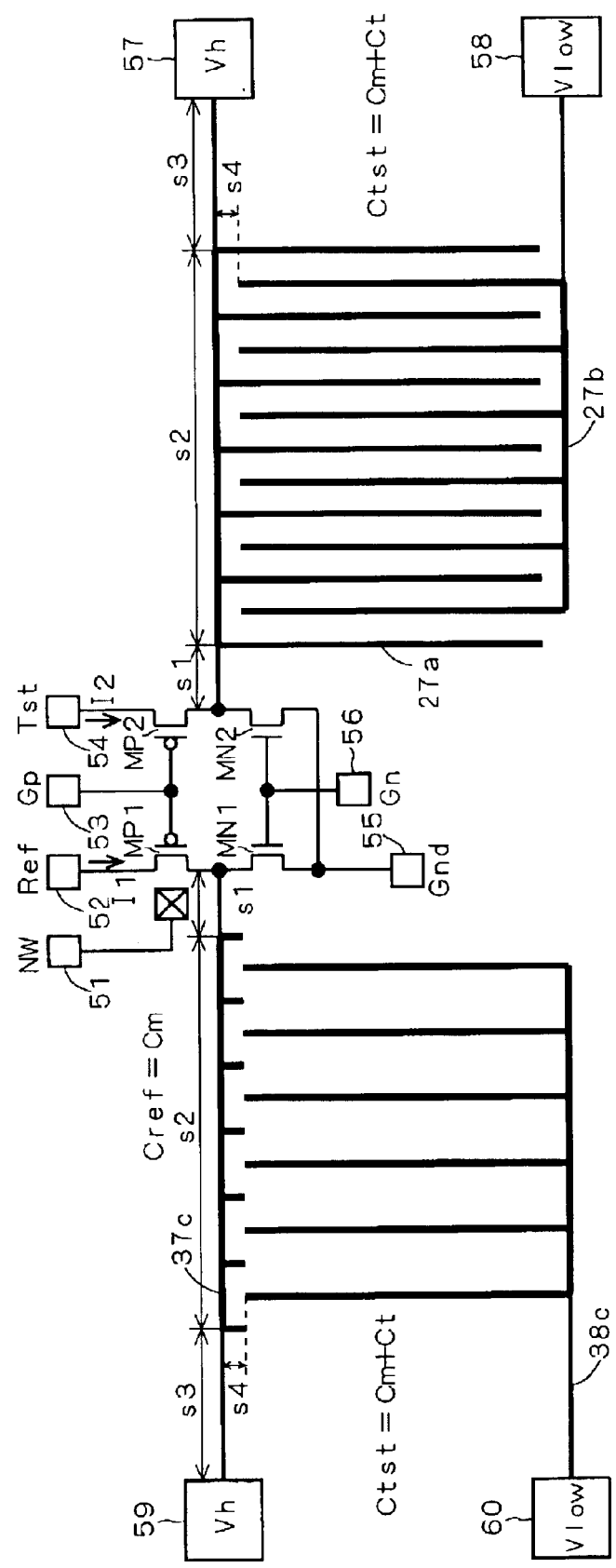
FIG. 25 is a diagram illustrating a fifth mode according to the third embodiment.

FIG. 25 is a diagram illustrating a fifth mode according to the third embodiment. In the fifth mode shown in FIG. 25, a dummy wiring capacitance pattern 38c which is substantially equivalent to the partial wiring capacitance pattern 27b is provided in addition to the fourth mode. Consequently, measuring precision in a capacitance value can be enhanced still more than that in the fourth mode.

(Sixth Mode)

Figure 26:
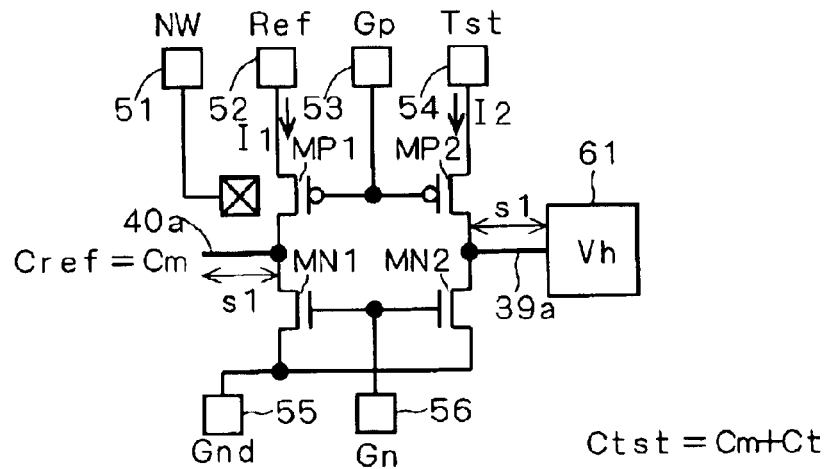
FIG. 26 is a diagram illustrating a sixth mode according to the third embodiment.

FIG. 26 is a diagram illustrating a parasitic capacitance measuring circuit according to a sixth mode of the third embodiment. The parasitic capacitance measuring circuit according to the sixth mode serves to measure a parasitic capacitance around a pad 61 for an LCR meter.

In the sixth mode shown in FIG. 26, there is provided a dummy wiring capacitance pattern 40a having the same dimension as a pattern dimension s1 between a node N2 and the pad 61 for an LCR meter. Consequently, it is possible to further enhance measuring precision in a capacitance value by excluding a capacitance other than the parasitic capacitance of the pad 61 for an LCR meter from a measuring object.

(Seventh Mode)

Figure 27:
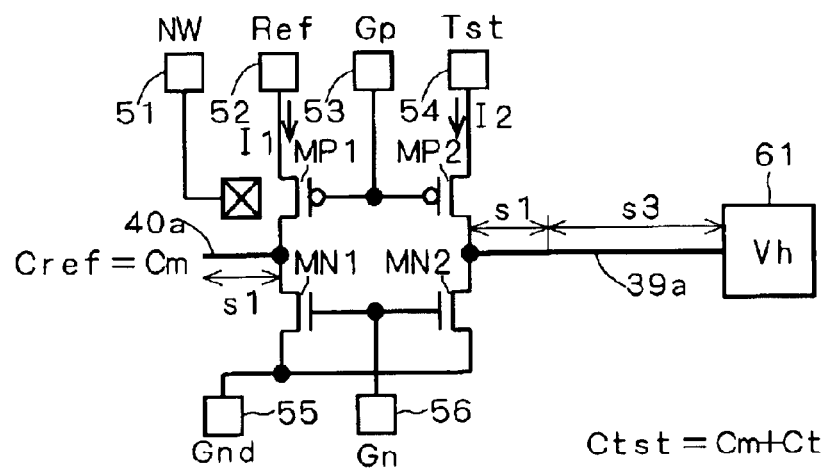
FIG. 27 is a diagram illustrating a seventh mode according to the third embodiment.
Figure 27:
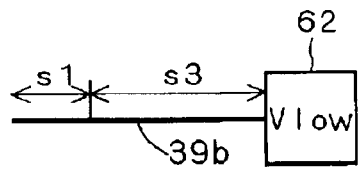

FIG. 27 is a diagram illustrating a parasitic capacitance measuring circuit according to a seventh mode of the third embodiment. The parasitic capacitance measuring circuit according to the seventh mode serves to measure a parasitic capacitance around a pad 61 for an LCR meter.

In the seventh mode shown in FIG. 27, there is provided a dummy wiring capacitance pattern 40a having a pattern dimension s1 in a pattern dimension of (s1+s3) of a partial wiring capacitance pattern 39 between a node 2 and the pad 61 for an LCR meter. Consequently, it is possible to enhance measuring precision in a capacitance value by excluding a part of a capacitance other than the parasitic capacitance of the pad 61 for an LCR meter from a measuring object. A partial wiring capacitance pattern 39b having the pattern dimension of (s1+s3) is formed in a pad 62 for an LCR meter.

(Eighth Mode)

Figure 28:
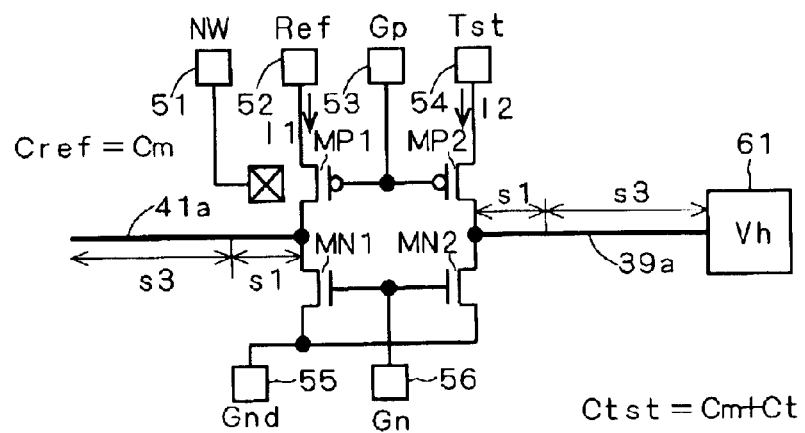
FIG. 28 is a diagram illustrating an eighth mode according to the third embodiment.
Figure 28:

FIG. 28 is a diagram illustrating a parasitic capacitance measuring circuit according to an eighth mode of the third embodiment. The parasitic capacitance measuring circuit according to the eighth mode serves to measure a parasitic capacitance around a pad 61 for an LCR meter.

In the eighth mode shown in FIG. 28, there are provided a dummy wiring capacitance pattern 41a equivalent to a partial wiring capacitance pattern 39 having a pattern dimension of (s1+s3) and a dummy wiring capacitance pattern 41b and a dummy pad 64 which are equivalent to a partial wiring capacitance pattern 39b having the pattern dimension of (s1+s3) and a pad 62 for an LCR meter. Consequently, it is possible to enhance measuring precision in a capacitance value still more by excluding a capacitance other than the parasitic capacitance of the pad 61 for an LCR meter from a measuring object.

While a capacitance incidental to a line and space wiring and a pad has been taken as an example of a capacitance to be shared for the measurement of the LCR meter and the measurement of the CBCM in the above description, it is also possible to employ a structure for measuring a capacitance such as a gate capacitance, a wiring plug (via plug) capacitance or a diffusion capacitance, which is not restricted.

Fourth Embodiment

Figure 29:
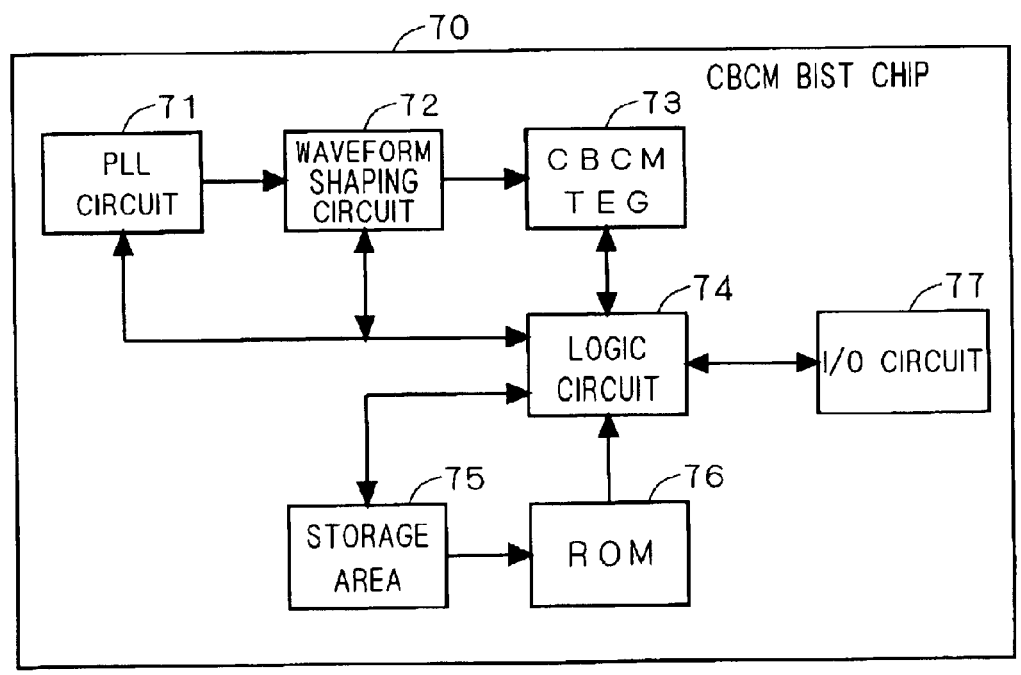
FIG. 29 is a block diagram showing a structure of a semiconductor device having a BIST function according to a fourth embodiment.

FIG. 29 is a block diagram typically showing a structure of a semiconductor device according to a fourth embodiment of the present invention. As shown in FIG. 29, a CBCM-BIST chip 70 to be the semiconductor device according to the fourth embodiment is characterized by a BIST (Built-in Self Test) function which is constituted by a PLL (Phase Locked Loop) circuit 71, a waveform shaping circuit 72, a CBCM circuit (TEG) 73, a logic circuit 74, a storage area 75, an ROM 76 and an I/O circuit 77.

By incorporating the CBCMTEG 73 having the BIST function in a chip, for example, a capacitance value of a simulated pattern for checking a capacitance array for an analog circuit requiring precision in a relative capacitance can be measured and a bit line capacitance of an SRAM, a DRAM, a flash memory, an FeRAM, an MRAM or the like can be measured, thereby grasping a chip provided in the same wafer plane or the same lot or having a capacitance other than specified precision for a reference value (TYPICAL value) in a mass-produced lot, and an address of a memory in the chip.

(Explanation of FIG. 29)

The PLL circuit 71 serves to oscillate at least one pulse having a specified frequency, and the waveform shaping circuit 72 serves to shape a waveform generated in the PLL circuit 71 into a specified waveform. The CBCMTEG 73 to be a circuit for CBCM is a TEG (Test Element Group) for measuring a capacitance by a CBCM method. The ROM (Read Only Memory) 76 stores a command group for controlling the measurement to be carried out by the CBCM method and sets conditions required for the measurement to be carried out by the CBCM method, for example, a power supply voltage, a measured frequency and the like. The I/O circuit 77 transfers and receives information to and from the outside. The logic circuit 74 reads information (including a command) such as measuring conditions from the storage area 75, controls the PLL circuit 71 to generate a specified frequency, and controls the waveform shaping circuit 72 to generate a specified pulse. The pulse corresponds to an NMOS gate potential Gn, a PMOS gate potential Gp, source switching clocks $\phi1$ and $\phi2$ and the like in a transistor constituting the CBCM in the CBCMTEG 73.

The CBCMTEG 73 may have a conventional circuit structure or the circuit structure disclosed in the present invention or may be another capacitance measuring circuit using the CBCM method.

The CBCMTEG 73 includes at least one capacitance measuring circuit using the CBCM method and may be provided with a plurality of capacitance measuring circuits using the CBCM method. The logic circuit 74 can measure a power supply potential Vdd, a ground potential Vss and a write current sent from a power supply in the CBCMTEG 73, can measure a measured frequency (a frequency of a pulse to be set into an NMOS gate potential Gn and a PMOS gate potential Gp), can calculate a measured capacitance in accordance with equations (1) to (3) and the like, for example, can store, in the storage area 75, information such as a lot number, a TEG number, a chip number, a measuring time, measuring conditions, a measured capacitance and the like in the CBCMTEG, and can transfer the information stored in the storage area 75 to the outside through the I/O circuit 77 in response to a read signal sent from the outside.

Thus, the CBCMBIST chip 70 constitutes the CBCMTEG 73 and a control circuit such as the PLL circuit 71, the waveform shaping circuit 72, the logic circuit 74 and the like into one chip. Consequently, it is possible to measure a capacitance value by the CBCM method in the CBCMBIST chip 70 itself without requiring a control signal sent from the outside.

(Example of Utilization of CBCMBIST Chip 70)

For example, in the case in which a capacitance of a bit line or a word line of a DRAM, an SRAM, a flash memory or the like is to be measured by the CBCMTEG 73 in the CBCMBIST chip 70, it is supposed that the capacitance is greatly different from a measured value of the capacitance of the bit line due to a disconnection of the bit line or the word line, a short circuit of the bit line (or the word line) with other wirings, and the like. In that case, defective portions can be specified based on an address of the bit line (or the word line) and a capacitance value thereof. The information is useful for efficiently carrying out failure analysis. Moreover, information about an address having a disconnection, a short circuit or the like can be transferred to a laser trimmer to laser trim a wiring of a memory cell in the DRAM, the SRAM or the like, thereby efficiently repairing a memory cell array.

Figure 30:
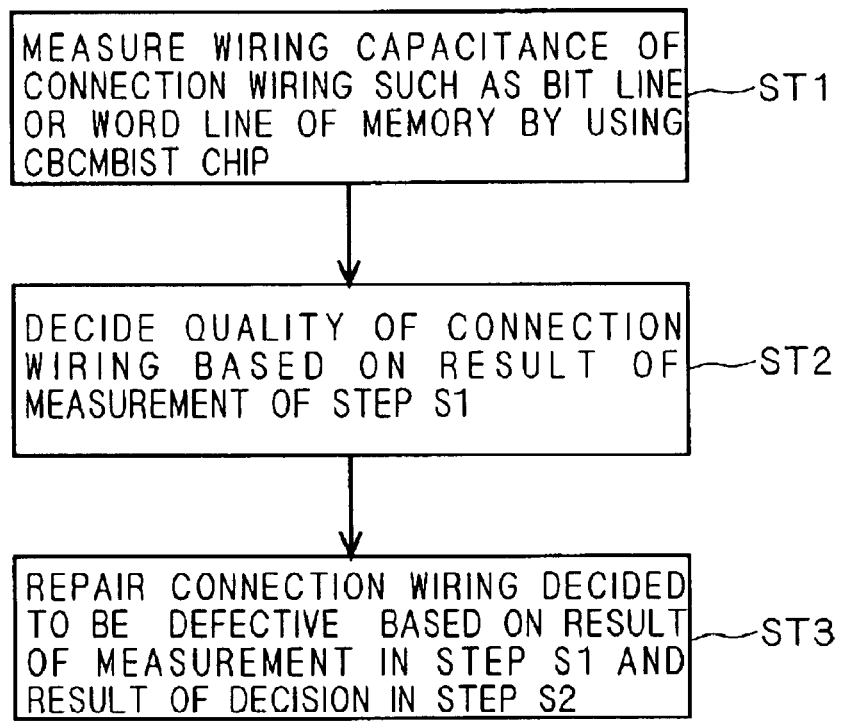
FIG. 30 is a flow chart showing a method of checking a memory using a CBCMBIST chip.

FIG. 30 is a flow chart showing a method of checking a memory using the CBCMBIST chip 70.

With reference to FIG. 30, a wiring capacitance of a connection wiring such as a bit line or a word line of a memory such as a DRAM, an SRAM, a flash memory, an FeRAM or an MRAM is measured by using the CBCMBIST chip 70 at a step ST1.

At a step ST2, then, the quality of the connection wiring is judged based on the result of the measurement in the step ST1. By measuring a micro wiring capacitance, thus, it is possible to accurately judge the quality of the connection wiring.

At a step ST3, thereafter, the defective portion of the connection wiring judged to be defective is specified based on the result of the measurement in the step ST1 and the result of the judgment in the step ST2, and the connection wiring judged to be defective is repaired by a conventional method. Accordingly, a defective connection wiring can be repaired properly. The repairing method is not restricted.

Any circuit for oscillating a pulse may be used for a VCO (Voltage Control Oscillator) circuit in the PLL circuit 71. For example, an oscillator utilizing a resonance of L or C or a ring oscillator utilizing a transistor such as a CMOS may be used for a VCO constituting a PLL. In the case of the ring oscillator, it is desirable that the number of steps of a ring should be set to be an odd number, and particularly, should be a prime number in order to suppress the influence of higher harmonics.

(Specific Example of CBCMTEG)

Figure 31:
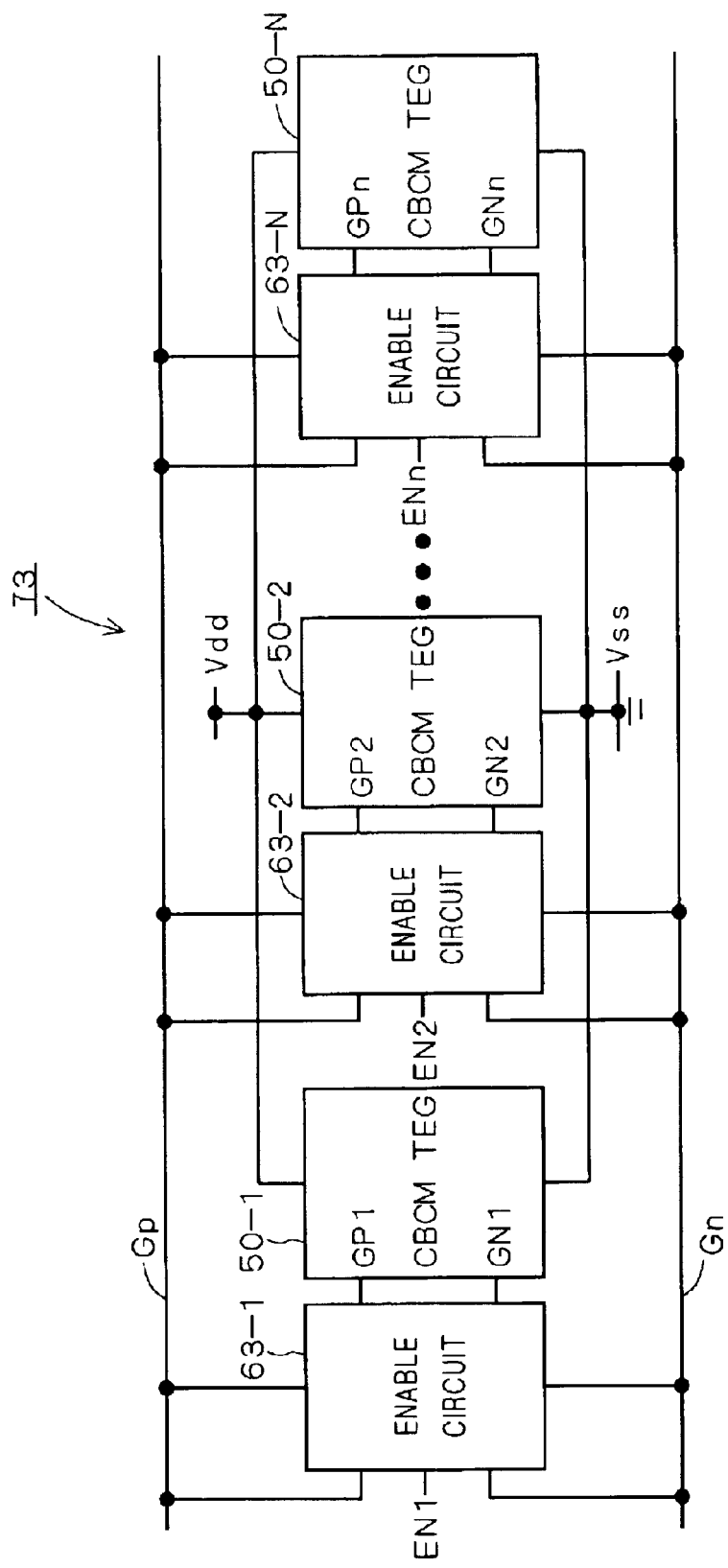
FIG. 31 is a diagram illustrating an internal structure of CBCMTEG in FIG. 29.

FIG. 31 is a typical diagram showing an example of the CBCMTEG 73 in FIG. 29. As shown in FIG. 31, the CBCMTEG 73 features that power supply terminals of a plurality of partial CBCMTEGs 50-1 to 50-N are shared and a control signal is enable controlled separately so that a plurality of CBCM evaluations can be continuously carried out with a current measuring (power supply) terminal fixed. Enable circuits 63-1 to 63-N receive enable signals EN1 to ENn at enable signal terminals. When the enable signals EN1 to ENn give an instruction of ON, the enable circuits 63-1 to 63-N become active to input a pulse to terminals GP1 to GPn and GN1 to GNn for an NMOS gate potential Gn and a PMOS gate potential Gp of the CBCMTEGs 50-1 to 50-N, thereby measuring a capacitance through a current measuring terminal (pads 52 and 54). In the CBCMTEG 73 shown in FIG. 31, for example, N partial CBCM circuits are provided, one of the enable signals EN1 to ENn can give an instruction of ON and one of the CBCM circuits can measure a capacitance. More specifically, the N partial CBCM circuits can be utilized selectively.

Figure 32:
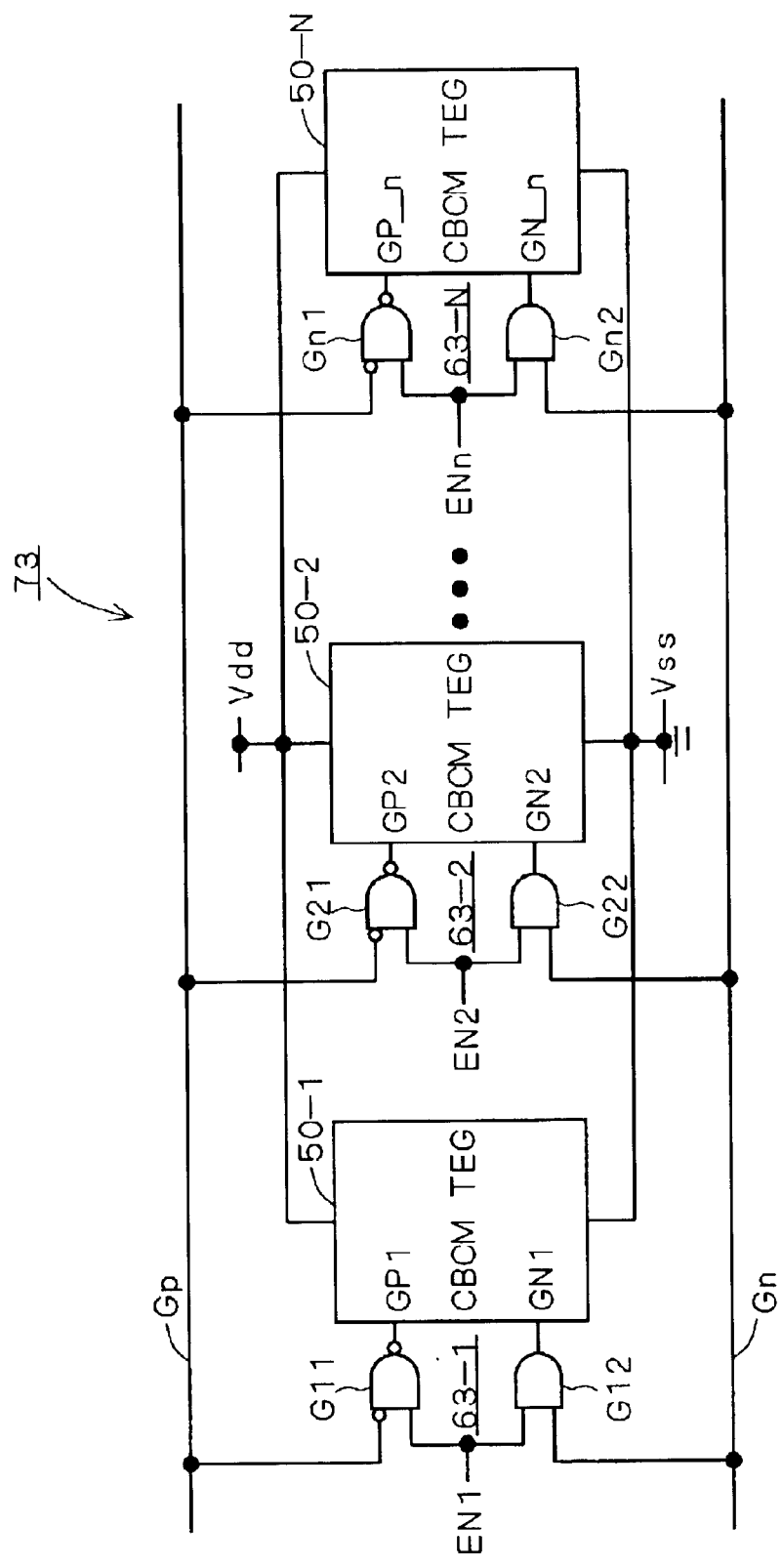
FIG. 32 is a diagram illustrating a detailed structure of FIG. 31.

FIG. 32 is a circuit diagram showing an example of the details of the enable circuit in FIG. 31. As shown in FIG. 32, the enable circuit 63-1 is constituted by a combination of an NAND gate G11 and an AND gate G12. More specifically, the NAND gate G11 receives an inversion signal of the PMOS gate potential Gp at one of inputs, and the AND gate G12 receives the NMOS gate potential Gn at one of inputs, and the NAND gate G11 and the AND gate G12 receive the enable signal EN1 at the other inputs. Similarly, the enable circuits 63-2 to 63-N are constituted by an NAND gate G21 and an AND gate G22 to an NAND gate Gn1 and an AND gate Gn2.

The structures of the enable circuits 63-1 to 63-N shown in FIG. 32 are only illustrative, and may be implemented by a combination of well-known logic circuits and is not restricted to the example of FIG. 32.

Moreover, the circuit shown in FIG. 32 does not need to be constituted by the CBCMTEG in the BIST but may be incorporated in a single CBCMTEG to produce the same effects.

The power supply potential Vdd and the ground potential Vss in the drawings according to the embodiment of the present invention are a power supply potential Vdd and a ground potential Vss in a chip and may be coincident with a power supply potential Vdd and a ground potential Vss on the outside of the chip or not.

Furthermore, even if the semiconductor device according to the embodiment of the present invention is formed on a main surface of an SOI (Silicon On Insulator) substrate or an SON (Silicon On Nothing) substrate in place of an ordinary silicon substrate, the same effects can be obtained.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate; and
   a CBCM (Charge Based Capacitance Measurement) circuit configured to measure a capacitance of a measuring terminal, said CBCM circuit including,
      said measuring terminal,
      a power supply terminal which charges/discharges said measuring terminal, and
      a first insulated gate type transistor interposed between said test terminal and said power supply terminal, said first insulated gate type transistor including,
         a gate insulating film formed selectively on said semiconductor substrate,
         a gate electrode formed on said gate insulating film,
         first and second source-drain regions of a second conductivity type, and
         a body region of a first conductivity type interposed between said first and second source-drain regions and under said gate electrode, said body region having a substantially uniform impurity concentration.

2. The semiconductor device according to claim 1, wherein
   at least one of said first and second source drain regions includes a partial source-drain region having an impurity concentration of $10^{18}/cm^3$ or less.

3. The semiconductor device according to claim 1, wherein
   at least one of said first and second source-drain regions includes a first partial source-drain region being a first formation depth, and a second partial source-drain region being a second formation depth which is greater than said first formation depth, and
   said first and second partial source-drain regions form first and second PN junctions with said body region, respectively, and an impurity concentration in said second PN junction is set to be lower than that in said first PN junction.

4. A semiconductor device comprising:
   a semiconductor substrate; and
   a CBCM (Charge Based Capacitance Measurement) circuit configured to measure a capacitance of a measuring terminal, said CBCM circuit including,
      said measuring terminal,
      a power supply terminal which charges/discharges said measuring terminal, and
      an insulated gate type transistor interposed between said measuring terminal and said power supply terminal, said insulated gate type insulator including, a bottom layer of said second conductivity type which is formed on said semiconductor substrate, a well region of a first conductivity type which is formed on said bottom layer, a gate insulating film formed selectively on said well region, a gate electrode formed on said gate insulating film, and first and second source-drain regions of a second conductivity type which is formed to interpose said well region provided under said gate electrode in a surface of said well region.

5. The semiconductor device according to claim 1, said CBCM circuit further including a logic circuit, and said logic circuit including, a second insulated gate type transistor said insulated gate type transistor has an electrical characteristic having higher capacitance value measuring precision by a CBCM method than that in said second insulated gate type transistor.

6. A semiconductor device comprising:

a CBCM circuit configured to measure a capacitance of a measuring terminal, said CBCM circuit including, said measuring terminal, a power supply terminal which charges/discharges said measuring terminal, and a first insulated gate type transistor interposed between said measuring terminal and said power supply terminal, said first insulated gate type transistor including, a gate insulating film formed selectively on said semiconductor substrate, a gate electrode formed on said gate insulating film, first and second source-drain regions of a second conductivity type, and a body region of a first conductivity type interposed between said first and second source-drain regions and under said gate electrode, and a logic circuit including a second insulating gate type transistor, said first insulated gate type transistor has an electrical characteristic having higher capacitance value measuring precision by a CBCM method than that in said second insulated gate type transistor.

7. The semiconductor device according to claim 6, wherein said first insulated gate type transistor receives supply of a power having a different electric potential from that of said second insulated gate type transistor.

8. The semiconductor device according to claim 6, further comprising:

a third insulated gate type transistor constituting a semiconductor storage device, wherein said first insulated gate type transistor has a transistor size equal to that of said third insulated gate type transistor.

9. The semiconductor device according to claim 6, further comprising:

a fourth insulated gate type transistor for an input/output circuit, wherein said first insulated gate type transistor has a transistor size equal to that of said fourth insulated gate type transistor.

10. The semiconductor device according to claim 9, wherein said first insulated gate type transistor has a greater thickness of a gate insulating film than that of said fourth insulated gate type transistor.

11. The semiconductor device according to claim 6, wherein said first insulated gate type transistor has a greater thickness of a gate insulating film than that of said second insulated gate type transistor.

12. The semiconductor device according to claim 6, wherein said first insulated gate type transistor has a greater gate length of a gate electrode than that of said second insulated gate type transistor.

* * * * *